: US005750421A

United States Patent [19]
Kasai et al.

[11] Patent Number: 5,750,421
[45] Date of Patent: May 12, 1998

[54] SEMICONDUCTOR DEVICE, CARRIER FOR CARRYING SEMICONDUCTOR DEVICE, AND METHOD OF TESTING AND PRODUCING SEMICONDUCTOR DEVICE

[75] Inventors: Junichi Kasai; Kazuto Tsuji; Norio Taniguchi; Takashi Mashiko; Masao Sakuma, all of Kawasaki; Yukio Saigo, Satsuma-gun; Yoshiyuki Yoneda; Masashi Takenaka, both of Kawasaki, all of Japan

[73] Assignees: Fujitsu Limited, Kawasaki; Kyushu Fujitsu Electronics Limited, Satsuma-gun; Fujitsu Automation Limited, Kawasaki, all of Japan

[21] Appl. No.: 789,625

[22] Filed: Jan. 27, 1997

Related U.S. Application Data

[62] Division of Ser. No. 441,462, May 15, 1995, Pat. No. 5,666,064, which is a division of Ser. No. 961,161, Oct. 16, 1992, Pat. No. 5,475,259.

Foreign Application Priority Data

| Oct. 17, 1991 | [JP] | Japan | 3-269645 |
| Feb. 12, 1992 | [JP] | Japan | 4-25399 |
| May 22, 1992 | [JP] | Japan | 4-130900 |
| Jun. 12, 1992 | [JP] | Japan | 4-153842 |

[51] Int. Cl.$^6$ .................................. H01L 21/60
[52] U.S. Cl. .......... 438/106; 438/121; 438/125; 438/126
[58] Field of Search .................. 437/206, 207, 437/209, 217, 214, 220, 216, 221; 438/106, 121, 125, 126

[56] References Cited

U.S. PATENT DOCUMENTS

| 3,963,315 | 6/1976 | Bonis | 339/17 |
| 4,218,701 | 8/1980 | Shirasaki | 257/787 |
| 4,711,700 | 12/1987 | Cusack | 257/666 |
| 4,714,952 | 12/1987 | Takekawa et al. | 357/75 |
| 4,806,503 | 2/1989 | Yoshida et al. | 437/206 |
| 4,881,639 | 11/1989 | Matsuoka et al. | 206/328 |
| 5,026,303 | 6/1991 | Matsuoka et al. | 439/526 |
| 5,198,964 | 3/1993 | Ito et al. | 257/796 |
| 5,224,021 | 6/1993 | Takada et al. | 361/406 |
| 5,250,841 | 10/1993 | Sloan et al. | 257/48 |
| 5,358,905 | 10/1994 | Chui | 437/209 |
| 5,362,679 | 11/1994 | Wakefield | 437/209 |
| 5,366,963 | 11/1994 | Golwalker et al. | 437/209 |
| 5,369,058 | 11/1994 | Burns et al. | 437/209 |
| 5,375,320 | 12/1994 | Kinsman et al. | 29/827 |

FOREIGN PATENT DOCUMENTS

| 0 446 868 | 9/1981 | European Pat. Off. . |
| 0 295 007 | 12/1988 | European Pat. Off. . |
| 0 338 706 | 10/1989 | European Pat. Off. . |
| 59-117247 | 7/1984 | Japan . |
| 60-20546 | 2/1985 | Japan . |
| 61-74359 | 4/1986 | Japan . |
| 61-500879 | 5/1986 | Japan . |
| 63-175453 | 7/1988 | Japan . |
| 63-182841 | 7/1988 | Japan . |
| 63-211744 | 9/1988 | Japan . |
| 63-296360 | 12/1988 | Japan . |
| 1-128456 | 5/1989 | Japan . |
| 1-243560 | 9/1989 | Japan . |
| 2-49457 | 2/1990 | Japan . |
| 2-130950 | 5/1990 | Japan . |
| 2-294059 | 12/1990 | Japan . |
| 3-220756 | 9/1991 | Japan . |
| 2 094 552 | 9/1982 | United Kingdom . |
| 90/15517 | 12/1990 | WIPO . |

OTHER PUBLICATIONS

Research Disclosure, No. 313, May 1990 Havant GB, pp. 447-448, "Floating Quadfinger Carrier Operation—Formed Quadpack into Carrier", Abstrnr. 313 122.

*Primary Examiner*—John Niebling
*Assistant Examiner*—Michael S. Lebentritt
*Attorney, Agent, or Firm*—Staas & Halsey

[57] ABSTRACT

A semiconductor device including a plurality of leads respectively made up of an inner lead and an outer lead, a semiconductor chip electrically connected to the inner leads, and a package encapsulating at least the inner leads of the leads and the semiconductor chip so that the outer leads extend outwardly of the package. The package has an upper part and a lower part which have mutually different sizes such that a stepped part is formed between the upper and lower parts by the different sizes, and each of the outer leads have a wide part which is wider than other parts of the outer lead extending outwardly of the package only within the stepped part of the package.

4 Claims, 32 Drawing Sheets

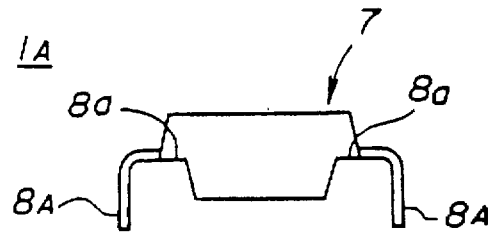
FIG.5A
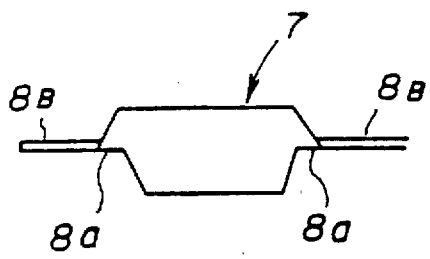
FIG.5B
FIG.6
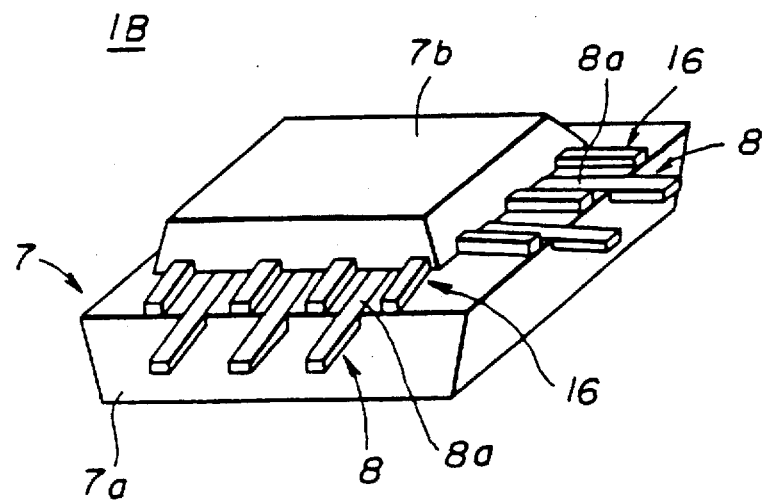

SEMICONDUCTOR DEVICE, CARRIER FOR CARRYING SEMICONDUCTOR DEVICE, AND METHOD OF TESTING AND PRODUCING SEMICONDUCTOR DEVICE

This application is a division of application Ser. No. 08/441,462, filed May 15, 1995, now U.S. Pat. No. 5,666,064, which is a division of application Ser. No. 07/961,161, filed Oct. 16, 1992, now U.S. Pat. No. 5,475,259.

BACKGROUND OF THE INVENTION

The present invention generally relates to semiconductor devices, carriers for carrying semiconductor devices and methods of testing and producing semiconductor devices, and more particularly, to a resin encapsulated semiconductor device having a plurality of pins, a carrier for carrying such a semiconductor device and methods of testing and producing such a semiconductor device.

The number of pins of semiconductor devices has increased due to improved integration density, and there are demands to further reduce the size of the semiconductor devices. As a result, the width and thickness of the outer leads, which are arranged at an extremely fine pitch, have become small, and the strength of the outer leads has become poor. For this reason, it is important that no stress is applied to the outer leads during the production stages and up to the time of mounting of the semiconductor device.

FIGS. 1(A) and 1(B) show an example of a conventional semiconductor device. FIG. 1(A) shows a plan view of this semiconductor device with a top part thereof omitted, and FIG. 1(B) shows a cross section of this semiconductor device along a line A—A in FIG. 1(A).

A semiconductor device 130 shown in FIGS. 1(A) and 1(B) is the so-called quad flat package type in which a semiconductor chip 133 is mounted on a stage 132 which is provided at a central part of a lead frame 131. The semiconductor chip 133 and inner leads 134 of the lead frame 131 are bonded by wires 135, and are encapsulated by molding a resin 136. In addition, outer leads 137 of the lead frame 131 are respectively formed into an approximate S-shape.

For example, the packages which have been developed include those having 300 or more pins with the outer leads 137 arranged at a pitch of 0.5 mm and those having 100 or more pins with the outer leads 137 arranged at a pitch of 0.4 or 0.3 mm. Hence, the thickness of the outer leads 137 is changing from approximately 200 μm to approximately 100 μm.

Because the width and thickness of the outer leads 137 have become small, it is necessary to form a solder fillet on the tip end of each outer lead 137 in order to obtain a sufficiently large strength at the time of mounting the semiconductor device 130 on a substrate. Accordingly, the tip end of the outer lead 137 is usually subjected to a plating process before the mounting so as to form the solder, tin or the like on the tip end of the outer lead 137.

For example, the lead frame 131 has a construction such that the tip ends of the outer leads 137 are not connected, the plating process is carried out at a stage before the semiconductor chip 133 is mounted and only the lead frame 131 exists or, after the molding of the resin 136. The outer leads 137 are bent after this plating process.

On the other hand, if the lead frame 131 has a construction such that the tip ends of the outer leads 137 are connected, the plating process is carried out after the molding of the resin 136 and after cutting the tip ends of the outer leads 137. In this case, the outer leads 137 are also bent after this plating process.

The characteristic of the semiconductor device 130 described above is tested when forwarded by the manufacturer or received by the user. When performing this test, tip ends of the outer leads 137 of the semiconductor device 130 are contacted by probes or sockets of a piece of test equipment.

However, the width and thickness of the outer lead 137 have become small and the outer lead 137 has become weak as described above. For this reason, there is a problem in that the outer lead 137 may become deformed when contacted by the probe or socket of the test equipment in order to perform the test.

In addition, when testing the semiconductor device 130, the length of the signal path from the contact of the probe or socket to the semiconductor chip 133 and including the length of the external lead 137 becomes relatively long. As a result, there is a problem in that the characteristic of the semiconductor device 130 is easily affected by the impedance of this relatively long signal path, particularly when the semiconductor device 130 includes an element which operates at a high speed.

On the other hand, the plating process with respect to the outer leads 137 is carried out in a state where the tip ends of the outer leads 137 have been cut and before the outer leads 137 are bent. For this reason, there is a problem in that the outer leads 137 may become deformed after the plating process, thereby greatly deteriorating the position accuracy of the outer leads 137.

Furthermore, if the semiconductor package is handled or forwarded by the manufacturer or the user for the purpose of testing or the like after the outer leads 137 are formed and up to the time when the semiconductor device 130 is mounted, the semiconductor package is accommodated within a tray. As a result, there is a problem in that this accommodation of the semiconductor package within the tray may cause deformation of the outer leads 137.

SUMMARY OF THE INVENTION

Accordingly, it is a general object of the present invention to provide a novel and useful semiconductor device, a carrier for carrying such a semiconductor device and methods of testing and producing such a semiconductor device, in which the problems described above are eliminated.

Another and more specific object of the present invention is to provide a semiconductor device comprising a plurality of leads respectively made up of an inner lead and an outer lead, a semiconductor chip electrically connected to the inner leads, and a package encapsulating at least the inner leads and the semiconductor chip so that the outer leads extend outwardly from the package, where the package has an upper part and a lower part which have mutually different sizes such that a stepped part is formed between the upper and lower parts by the different sizes, and each of the outer leads has a wide part which is wider than other parts of the outer lead extending outwardly from the package only within the stepped part of the package. According to the semiconductor device of the present invention, it is possible to prevent deformation of the outer leads when testing the performance of the semiconductor device by contacting probes or the like to the outer leads.

Still another object of the present invention is to provide a carrier for carrying a semiconductor device which comprises a plurality of leads respectively made up of an inner lead and an outer lead, a semiconductor chip electrically connected to the inner leads, and a generally rectangular package encapsulating at least the inner leads and the semiconductor chip so that the outer leads extend outwardly from the package, where the package has an upper part and a lower part which have mutually different sizes such that a stepped part is formed between the upper and lower parts by the different sizes, and each of the outer leads has a part which is exposed at the stepped part of the package. The carrier comprises a sidewall part which has a hollow rectangular column shape which opens to the top and bottom thereof, and locking parts provided on the sidewall part for locking at least corners of the stepped part of the semiconductor device which is accommodated within the sidewall part, where the sidewall part surrounds sides of the semiconductor device to protect the outer leads. According to the carrier of the present invention, it is possible to protect the outer leads from deformation when handling the semiconductor device.

A further object of the present invention is to provide a method of testing a semiconductor device which comprises a plurality of leads respectively made up of an inner lead and an outer lead, a semiconductor chip electrically connected to the inner leads, and a generally rectangular package encapsulating at least the inner leads and the semiconductor chip so that the outer leads extend outwardly from the package, where the package has an upper part and a lower part which have mutually different sizes such that a stepped part is formed between the upper and lower parts by the different sizes, and each of the outer leads has a part which is exposed at the stepped part of the package. The method comprises the steps of (a) placing the semiconductor device in a testing position on a socket so that probes of the socket make contact with corresponding outer leads which are exposed at the stepped part of the package of the semiconductor device, and (b) checking performance of the semiconductor device by supplying signals from a piece of testing equipment to the outer leads via the probes of the socket. According to the method of testing the semiconductor device of the present invention, it is possible to easily test the performance of the semiconductor device without deforming the outer leads.

Another object of the present invention is to provide a method of producing a semiconductor device which comprises a plurality of leads respectively made up of an inner lead and an outer lead, a semiconductor chip electrically connected to the inner leads, and a generally rectangular package encapsulating at least the inner leads and the semiconductor chip so that the outer leads extend outwardly from the package, where the package has an upper part and a lower part which have mutually different sizes such that a stepped part is formed between the upper and lower parts by the different sizes, and each of the outer leads has a part which is exposed at the stepped part of the package. The method comprises the steps of (a) placing the semiconductor device on a support so that the semiconductor device is supported by the stepped part and a smaller one of the upper and lower parts of the package, and (b) plating a metal on the outer leads. According to this method of producing the semiconductor device of the present invention, it is possible to carry out the plating process with respect to the outer leads without applying an external force on the outer leads, the external force possibly resulting in the deformation of the outer leads.

Still another object of the present invention is to provide a method of producing a semiconductor device comprising the steps of (a) placing a semi-completed device, having leads, in a molding position within a cavity which is formed by first and second dies which connect via a palette, where the cavity is formed by a recess of the first die and an opening of the palette, the first die has a first gate which communicates to the recess, the palette has a second gate which communicates to the opening, and at least one of the first die and the palette has a runner which communicates with the first and second gates, and (b) injecting a resin into the cavity via the runner and the first and second gates to mold a resin package which encapsulates the semi-completed device so that the leads extend outwardly from the resin package, where the recess is larger than the opening so that one half of the package above the leads is larger than the remaining half of the package below the leads and the leads are exposed at a stepped part which is formed by a difference between the sizes of the two halves forming the package. According to this method of producing the semiconductor device of the present invention, it is possible to easily form the package which has one half larger than the other half, without forming a mark of the gate of the die.

A further object of the present invention is to provide a semiconductor device comprising a plurality of leads respectively made up of an inner lead and an outer lead, a semiconductor chip electrically connected to the inner leads, a package encapsulating at least the inner leads and the semiconductor chip so that the outer leads extend outwardly from the package, where the package has an upper part and a lower part which have mutually different sizes such that a stepped part is formed between the upper and lower parts by the different sizes, and each of the outer leads has a wide part which is wider than other parts of the outer lead extending outwardly from the package only within the exposed part of the package, and a radiator member provided on the stepped part so as to improve thermal conduction of heat generated from the semiconductor chip, where the radiator member is made of a material having a thermal conductivity higher than that of the package. According to the semiconductor device of the present invention, it is possible to efficiently radiate the heat generated from the semiconductor chip.

Other objects and further features of the present invention will be apparent from the following detailed description when read in conjunction with the accompanying drawings.

BRIEF DESCRIPTION OF THE DRAWINGS

FIGS. 5(A) and 5(B) show modifications of the shape of outer leads;

FIG. 6 is a perspective view from the bottom showing a second embodiment of the semiconductor device according to the present invention;

FIGS. 32(A), 31(B) and 32(C) are diagrams for explaining a resin molding of the tape carrier shown in FIG. 30;

DESCRIPTION OF THE PREFERRED EMBODIMENTS

Figure 1A:
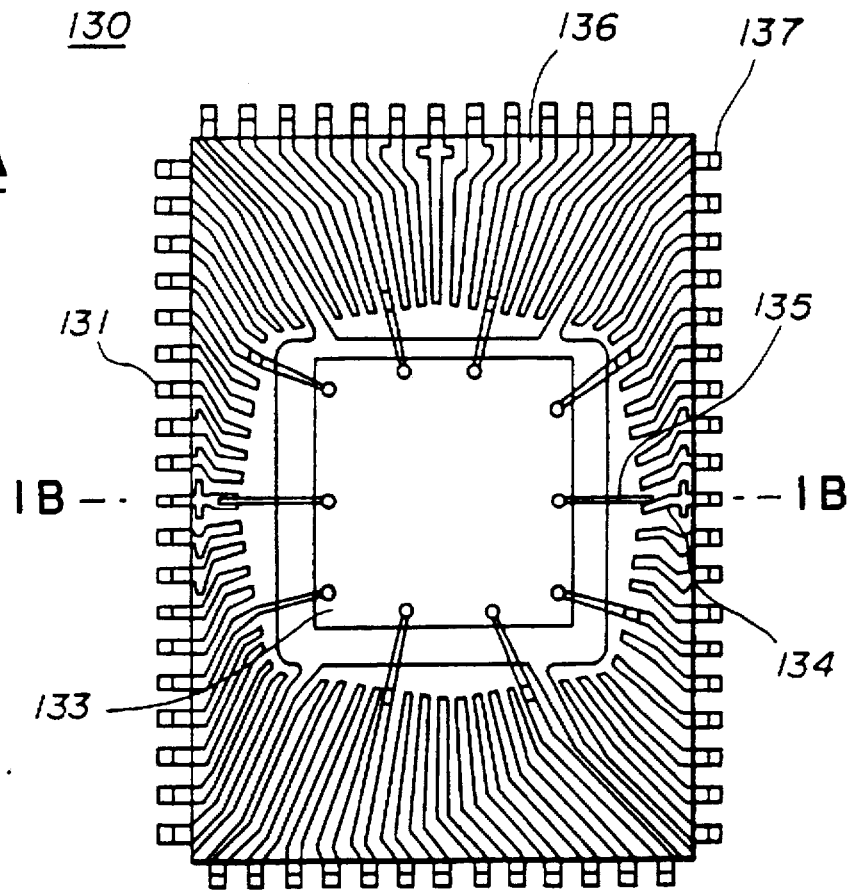
FIGS. 1(A) and 1(B) show an example of a conventional semiconductor device in a plan view and a cross sectional view for explaining the problems thereof.
Figure 1B:
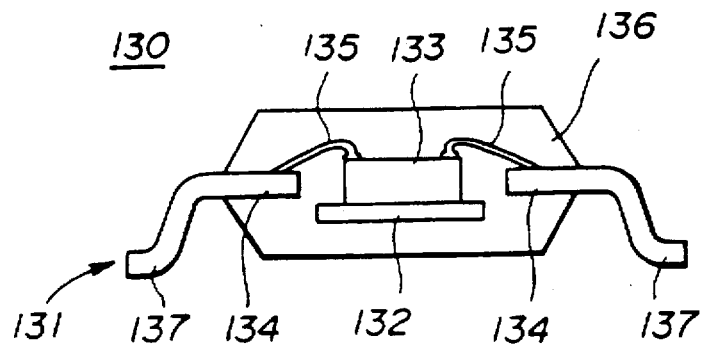
Figure 2A:
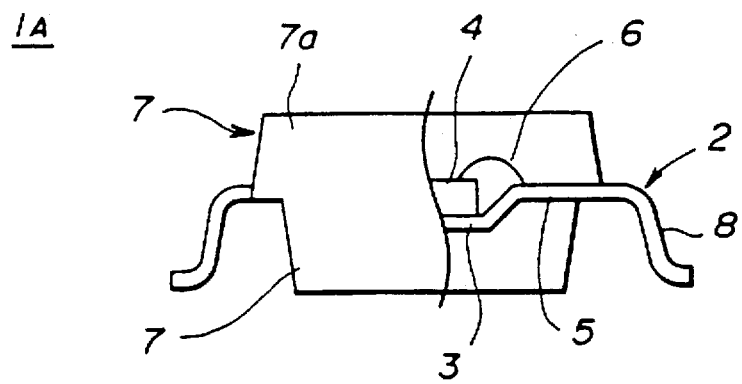
FIGS. 2(A) and 2(B) show a first embodiment of a semiconductor device according to the present invention in a side view and a bottom view.
Figure 2B:
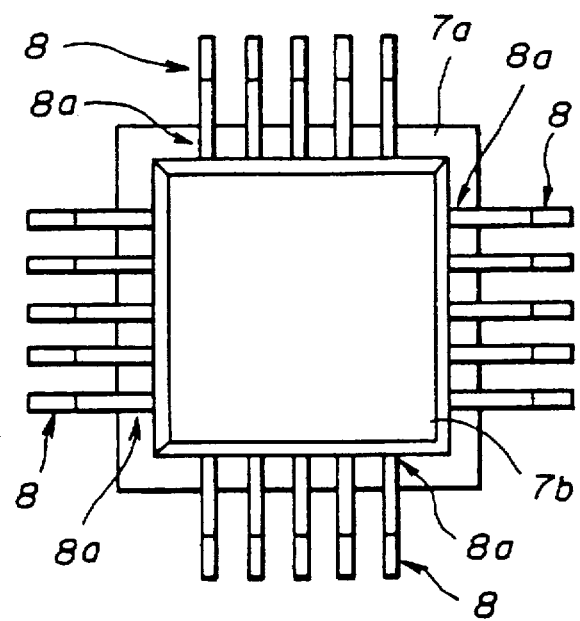

A description will be given of a first embodiment of a semiconductor device according to the present invention, by referring to FIGS. 2(A) and 2(B). FIG. 2(A) shows a side view of the first embodiment in partial cross section, and FIG. 2(B) shows a bottom view of the first embodiment.

A semiconductor device 1A shown in FIG. 2(A) has a chip 4 mounted on a stage 3 of a lead frame 2. The chip and inner leads of the lead frame 2 are bonded by wires 6. A package 7 is formed by molding a resin which encapsulates the chip 4, the stage 3 and the inner leads 5. Outer leads 8 of the lead frame 2 are bent in an approximate S-shape to suit the mounting of the semiconductor device 1A on a circuit substrate (not shown).

An upper resin 7a of the package 7 above the outer leads 8 is made larger than a lower resin 7b. The difference between the sizes of the upper and lower resins 7a and 7b forms an exposed part 8a where the lower surfaces of the outer leads 8 become exposed at the lower surface edge part of the upper resin 7a. The peripheral surface of the exposed part 8a is embedded in the lower surface edge part of the upper resin 7a. At least the exposed part 8a of each outer lead 8 is exposed at the lower surface edge part of the upper resin 7a.

For example, the outer leads 8 have a width of 0.1 to 0.2 mm and a thickness of 100 μm, and are arranged at a pitch of 0.3 to 0.4 mm. In addition, there are 100 or more outer leads 8.

In this case, 400 μm of the outer lead 8 is exposed at the exposed part 8a. In other words, this 400 μm corresponds to the lead length which is required to contact the probe when testing the characteristic of the semiconductor device 1A. The testing method will be described later.

Figure 3:
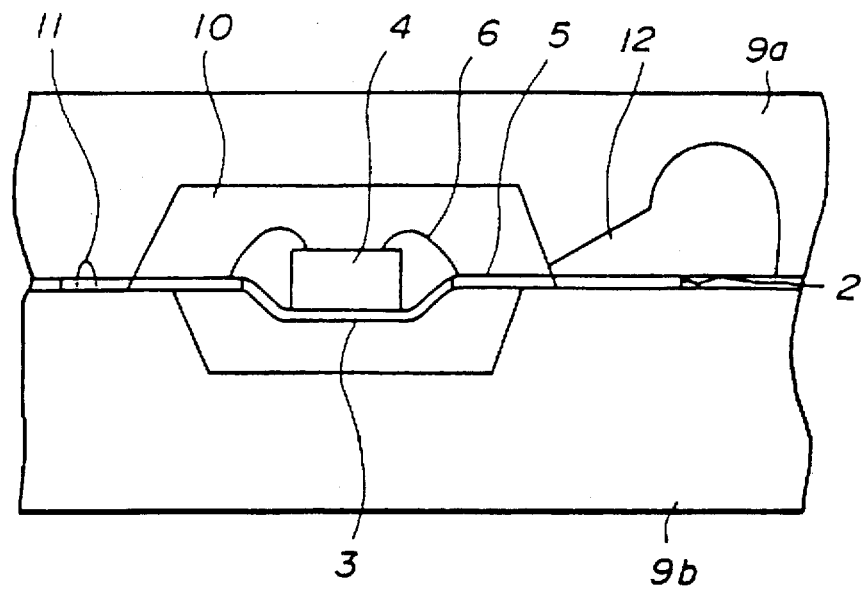
FIG. 3 is a cross sectional view for explaining a method of producing the first embodiment of the semiconductor device.

FIG. 3 is a cross sectional view for explaining a method of producing the semiconductor device 1A. First, the chip 4 is mounted on the stage 3 of the lead frame 2, and the chip 4 and the inner leads 5 are bonded by the wires 6. Thereafter, the molding part on the periphery of the chip 4 is positioned within a cavity 10 which is formed by upper and lower metal dies 9a and 9b.

The space of the upper metal die 9a is larger than the space of the lower metal die 9b, and these two spaces form the cavity 10. Hence, the inner leads 5 of the lead frame 2 and a part of the outer leads 8 are covered by the upper metal die 9a. A projection 11 is formed on the lower metal die 9b for the purpose of positioning the lead frame 2. This projection 11 penetrates the lead frame 2 and fits into a hole of the upper metal die 9a.

The resin is injected via a gate 12 which is formed in the upper metal die 9a, so as to mold the package 7 by the upper and lower resins 7a and 7b.

Next, a description will be given of a first method of testing the semiconductor device according to the present invention, by referring to FIG. 4. In this embodiment of the method, it is assumed for the sake of convenience that the first embodiment of the semiconductor device shown in FIGS. 2(A) and 2(B) is tested.

Figure 4:
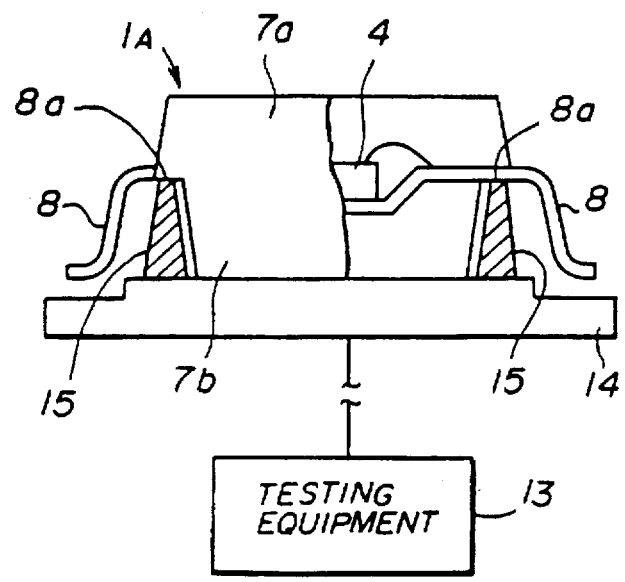
FIG. 4 is a diagram for explaining a first embodiment of a method of testing the semiconductor device according to the present invention.

In FIG. 4, a socket 14 of a piece of testing equipment 13 is provided with a number of probes 15 corresponding to the number of outer leads 8 of the semiconductor device 1A. When testing the characteristic of the semiconductor device 1A, the semiconductor device 1A is placed on the socket 14 so that the exposed part 8a of the outer leads 8 of the semiconductor device 1A make electrical contact with the corresponding probes 15. In this testing position, the exposed part 8a and the smaller one of the upper and lower resins 7a and 7b (that is, the lower resin 7b in this case) of the package 7 are supported by the socket 14.

In other words, when testing the characteristic of the semiconductor device 1A, it is simply necessary to place the semiconductor device 1A in the testing position on the socket 14. In addition, the contact between the probes 15 and the outer leads 8 is not made via the tip ends of the outer leads, but is made at the exposed part 8a where the three sides of each outer lead 8 are embedded in the upper resin 7a. Accordingly, it is possible to prevent unwanted deformation of the outer leads 8 even if the outer leads 8 are weak, and the test can be carried out with ease.

The actual testing operation depends on the kind of semiconductor device to be tested and may be carried out in a known manner. For example, a power source voltage, testing signals and the like are supplied from the testing equipment 13 to the semiconductor device 1A via the probes 15 of the socket 14, and output signals of the semiconductor device 1A are compared with anticipated design values to check the performance or characteristic of the semiconductor device 1A.

Also, the length of the probe 15 which forms the signal path can be shortened compared to the conventional case. In addition, the signal path can be shortened because the probe 15 makes contact with the corresponding outer lead 8 at a position close to the chip 4, and thus, it is possible to avoid the increase of the impedance which would occur if the signal path were long. As a result, it is possible to carry out an accurate test of the characteristic of the semiconductor device 1A because there is no increase in the impedance which would affect the characteristic of the semiconductor device 1A.

Next, a description will be given of modifications of the shape of the outer leads, by referring to FIGS. 5(A) and 5(B).

In the first embodiment of the semiconductor device shown in FIGS. 2(A) and 2(B), the outer leads 8 have an approximate S-shape. However, according to a first modification shown in FIG. 5(A), each outer lead $8^A$ is bent to an approximate L-shape. Furthermore, according to a second modification shown in FIG. 5(B), each outer lead $8^B$ is not bent and thus has a linear shape. In the modifications shown in FIGS. 5(A) and 5(B), the outer leads $8_A$ and $8_B$ also have the exposed part 8a, and the effects obtained by these modifications are the same as those obtainable by the first embodiment of the semiconductor device.

Next, a description will be given of a second embodiment of the semiconductor device according to the present invention, by referring to FIG. 6. FIG. 6 shows a perspective bottom view of the second embodiment. In FIG. 6, those parts which are the same as those corresponding parts in FIG. 2 are designated by the same reference numerals, and a description thereof will be omitted.

A semiconductor device $1^B$ shown in FIG. 6 has the exposed part 8a formed on the lower surface of the outer leads 8 and the upper resin 7a is larger than the lower resin 7b, similarly to the first embodiment of the semiconductor device. But in this second embodiment of the semiconductor device, projections 16 are formed on both sides of each outer lead 8 at the exposed part 8a. The projection 16 is integrally formed on the upper resin 7a.

The effects obtained by this second embodiment of the semiconductor device are the same as those obtainable by the first embodiment of the semiconductor device. In addition, the projections 16 have the function of restricting the positions of the probes 15 shown in FIG. 4 which make contact with the corresponding outer leads 8 at the exposed part 8a. In other words, this second embodiment prevents positional error of the probes 15 so that the test can be carried out positively.

In FIG. 6, the upper resin 7a of the package 7 is larger than the lower resin 7b. However, it is also possible to make the lower resin 7b of the package 7 larger than the upper resin 7b. In this case, the exposed part 8a is formed at the upper surfaces of the outer leads 8, and the projections 16 are integrally formed on the lower resin 7b. The probes may in this case be arranged above the semiconductor device $1_B$, so that each probe makes positive electrical contact with the corresponding outer lead 8 at the exposed part 8a by being restricted with respect to its position by the projections 16.

The outer leads 8 shown in FIG. 6 may be shaped in any of the manners shown in FIGS. 2(A), 5(A) and 5(B).

Figure 7A:
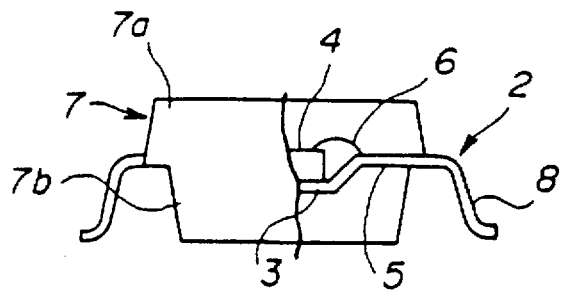
FIGS. 7(A), 7(B) and 7(C) show a third embodiment of the semiconductor device according to the present invention in a side view, a bottom view and an enlarged bottom view in part.
Figure 7B:
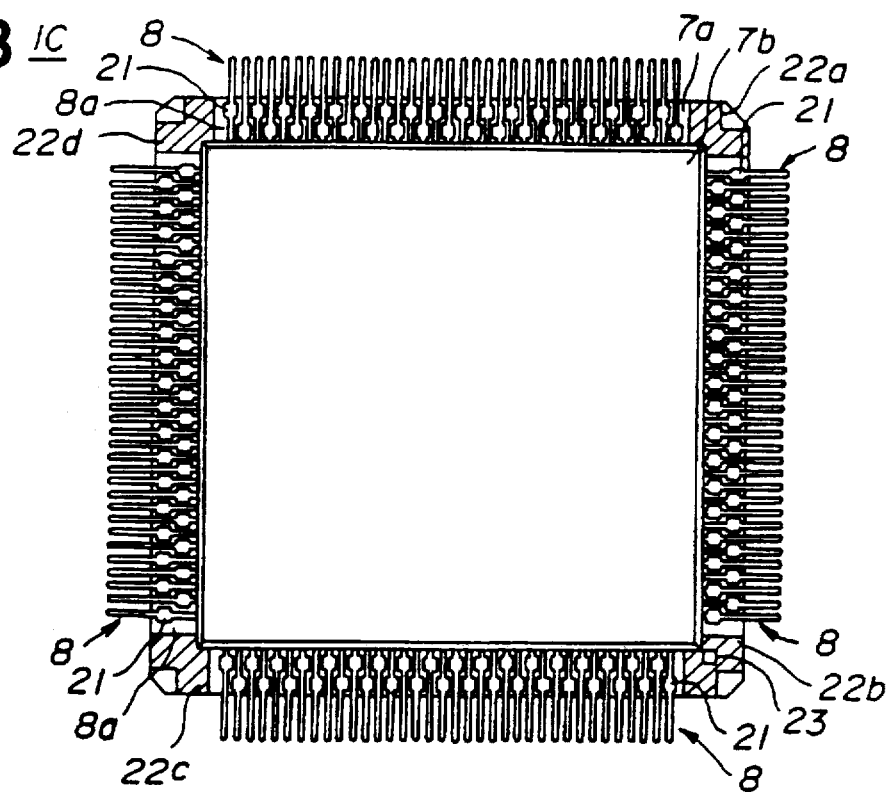
Figure 7C:
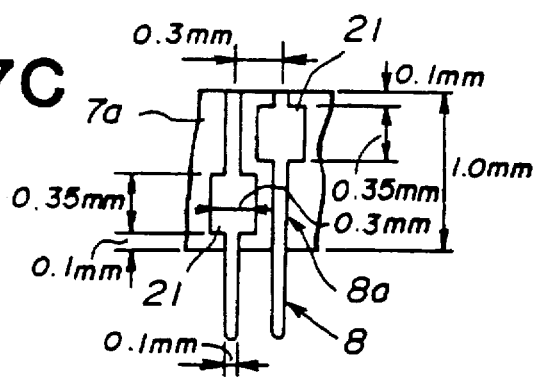

Next, a description will be given of a third embodiment of the semiconductor device according to the present invention, by referring to FIGS. 7(A)–7(C). FIG. 7(A) shows a side view of the third embodiment in partial cross section, FIG. 7(B) shows a bottom view of the third embodiment, and FIG. 7(C) shows an enlarged bottom view of outer leads at an exposed part. In FIGS. 7(A)–7(C), those parts which are the same as those corresponding parts in FIG. 2 are designated by the same reference numerals, and a description thereof will be omitted.

A semiconductor device 1C shown in FIGS. 7(A) and 7(B) has a chip 4 mounted on a stage 3 of a lead frame 2. The chip and inner leads 5 of the lead frame 2 are bonded by wires 6. A package 7 is formed by molding a resin which encapsulates the chip 4, the stage 3 and the inner leads 5. Outer leads 8 of the lead frame 2 are bent in an approximate S-shape to suit the mounting of the semiconductor device 1C on a circuit substrate (not shown).

An upper resin 7a of the package 7 above the outer leads 8 is made larger than a lower resin 7b. The difference between the sizes of the upper and lower resins 7a and 7b forms an exposed part 8a where the lower surfaces of the outer leads 8 becomes exposed at the lower surface edge part of the upper resin 7a. The peripheral surface of the exposed part 8a is embedded in the lower surface edge part of the upper resin 7a. At least the exposed part 8a of the outer leads 8 is exposed at the lower surface edge part of the upper resin 7a.

A wide part 21 is formed at a predetermined part of each outer lead 8 on the upper resin 7a at the exposed part 8a. The wide parts 21 of the adjacent outer leads 8 are arranged in a zigzag or checker-board pattern.

For example, the width of the outer lead 8 is 0.1 mm, the outer leads 8 are arranged at a pitch of 0.3 mm, and the difference between the sizes of the upper and lower resins 7a and 7b is 1.0 mm, as shown in FIG. 7(C). At the exposed part 8a within the 1.0 mm wide part of the upper resin 7a, the wide parts 21, respectively, having the size of 0.3×0.35 mm, are arranged in a zigzag or checker-board pattern. This arrangement of the wide parts 21 can easily be realized by forming the wide parts 21 in the process of forming the lead frame 2.

By the provision of the wide parts 21, it becomes possible to align the probes to the corresponding outer leads 8 so as to make positive contact to the corresponding outer leads 8 when making the test, even if the number of leads increases and the width of each lead becomes narrow.

Metal parts 22a through 22d may be provided at the four corners of the upper resin 7a where no outer lead 8 is provided, as shown in FIG. 7(B). The metal parts 22a through 22d may be used for positioning purposes, and a hole 23 or the like is formed in the metal parts 22a through 22d. The metal parts 22a through 22d may be integrally formed on the lead frame 2, and in this case, it is possible to improve the final positioning accuracy.

Figure 8:
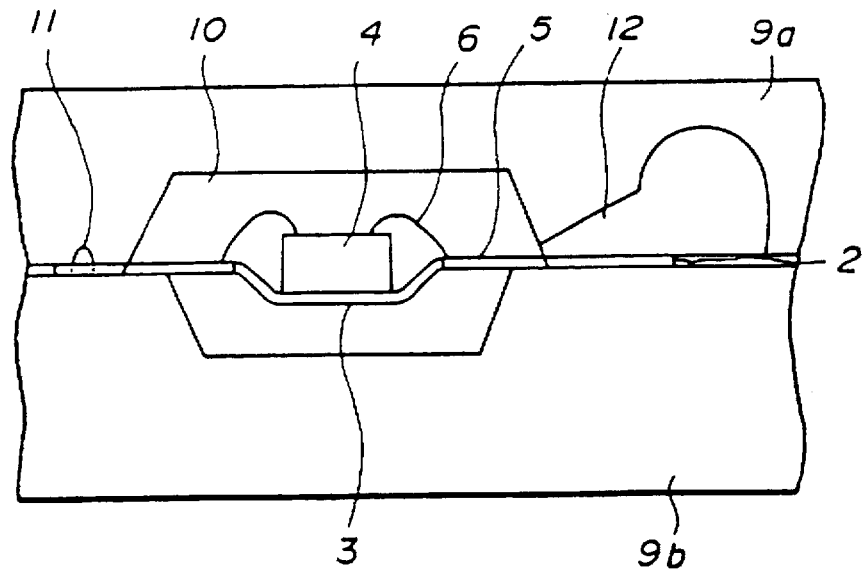
FIG. 8 is a cross sectional view for explaining a method of producing the third embodiment of the semiconductor device.

FIG. 8 is a cross sectional view for explaining a method of producing the semiconductor device 1C. First, the chip 4 is mounted on the stage 3 of the lead frame 2, and the chip 4 and the inner leads 5 are bonded by the wires 6. Thereafter, the molding part on the periphery of the chip 4 is positioned within a cavity 10 which is formed by upper and lower metal dies 9a and 9b.

The space of the upper metal die 9a is larger than the space of the lower metal die 9b, and these two spaces form the cavity 10. Hence, the inner leads 5 of the lead frame 2 and a part of the outer leads 8 are covered by the upper metal die 9a. A projection 11 is formed on the lower metal die 9b for the purpose of positioning the lead frame 2. This projection 11 penetrates the lead frame 2 and fits into a hole of the upper metal die 9a.

The resin is injected via a gate 12 which is formed in the upper metal die 9a, so as to mold the package 7 by the upper and lower resins 7a and 7b.

Next, a description will be given of a second method of testing the semiconductor device according to the present invention, by referring to FIG. 9. In this embodiment of the method, it is assumed for the sake of convenience that the third embodiment of the semiconductor device shown in FIGS. 7(A)–7(C) is tested.

Figure 9:
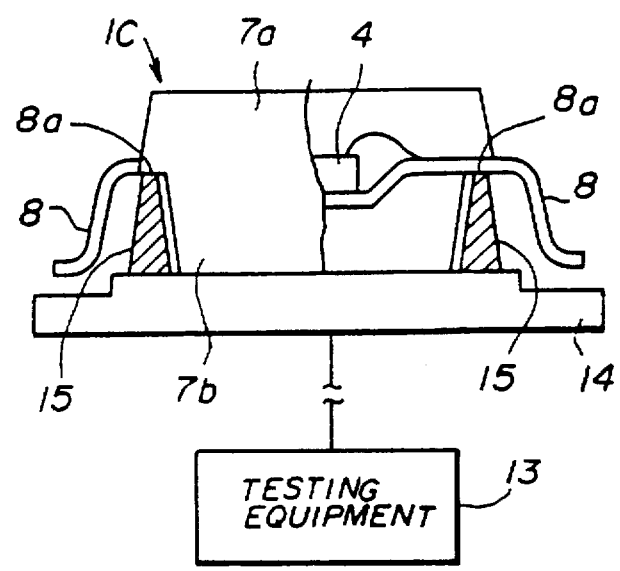
FIG. 9 is a diagram for explaining a second embodiment of a method of testing the semiconductor device according to the present invention.

In FIG. 9, a socket 14 of a piece of testing equipment 13 is provided with a number of probes 15 corresponding to the number of outer leads 8 of the semiconductor device 1C. When testing the characteristic of the semiconductor device 1C, the semiconductor device 1C is placed on the socket 14 so that the exposed part 8a of the outer leads 8 of the semiconductor device 1C make electrical contact with the corresponding probes 15.

In other words, when testing the characteristic of the semiconductor device 1C, it is simply necessary to place the semiconductor device 1C in the testing position on the socket 14. In addition, the contact between the probes 15 and the outer leads 8 is not made via the tip end of the outer leads, but is made at the exposed part 8a where the three sides of each outer lead 8 are embedded in the upper resin 7a. Accordingly, it is possible to prevent unwanted deformation of the outer leads 8 even if the outer leads 8 are weak, and the test can be carried out with ease. Furthermore, the contact between the probe 15 and the corresponding outer lead 8 is particularly satisfactory if the probe 15 is positioned to make contact with the wide part 21 of the corresponding outer lead 8.

Also, the length of the probe 15 which forms the signal path can be shortened compared to the conventional case. In addition, the signal path can be shortened because the probe 15 makes contact with the corresponding outer lead 8 at a position close to the chip 4, and thus, it is possible to avoid the increase of the impedance which would occur if the signal path were long. As a result, it is possible to carry out an accurate test of the characteristic of the semiconductor device 1A because there is no increase in the impedance which would affect the characteristic of the semiconductor device 1C.

In the third embodiment of the semiconductor device shown in FIG. 7(A), the outer leads 8 have the approximate S-shape. However, the outer leads 8 may be shaped as shown in the modifications of FIG. 5(A) and 5(B) described above. The effects obtained by such modifications are the same as those obtainable by the third embodiment of the semiconductor device.

In FIGS. 7(A)–7(C), the upper resin 7a of the package 7 is larger than the lower resin 7b. However, it is also possible to make the lower resin 7b of the package 7 larger than the upper resin 7b. In this case, the exposed part 8a is formed at the upper surfaces of the outer leads 8, and the projections 16 are integrally formed on the lower resin 7b. The probes may in this case be arranged above the semiconductor device $1_c$, so that each probe makes positive electrical contact with the corresponding outer lead 8 at the exposed part 8a.

Figure 10:
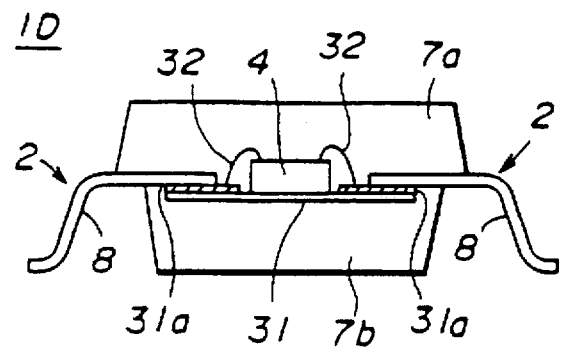
FIGS. 10 through 13 are cross sectional views respectively showing fourth through seventh embodiments of the semiconductor device according to the present invention.

Next, a description will be given of a fourth embodiment of the semiconductor device according to the present invention, by referring to FIG. 10. In FIG. 10, those parts which are the same as those corresponding parts in FIGS. 7(A)–7(C) are designated by the same reference numerals, and a description thereof will be omitted.

In a semiconductor device 1D shown in FIG. 10, the chip 4 is mounted on a substrate 31 which is provided within the lower resin 7b. A pattern 31a is formed on the substrate 31, and the chip 4 and inner ends of the pattern 31a are bonded by wires 32. The outer leads 8 of the lead frame are fixed to outer ends of the pattern 31a by an outer lead bonding (OLB), laser welding or the like, for example.

Figure 11:
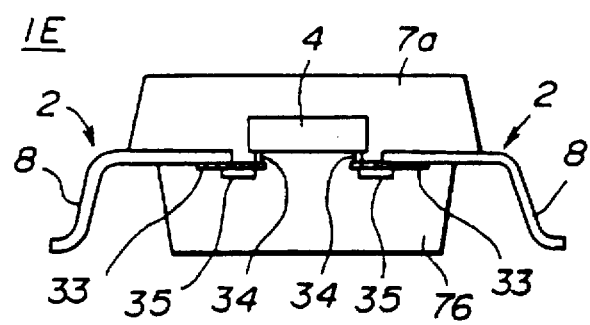

Next, a description will be given of a fifth embodiment of the semiconductor device according to the present invention, by referring to FIG. 11. In FIG. 11, those parts which are the same as those corresponding parts in FIG. 7 are designated by the same reference numerals, and a description thereof will be omitted.

In a semiconductor device 1E shown in FIG. 11, the chip 4 is bonded to the inner ends of a pattern 33 which is made of copper, for example by bumps 34. The outer leads 8 are bonded to the outer ends of the pattern 33 by OLB, laser welding or the like. In this case, in order to prevent the scattering of the pattern 33 during the production stage, a film carrier 35 is mounted on the pattern 33.

Figure 12:
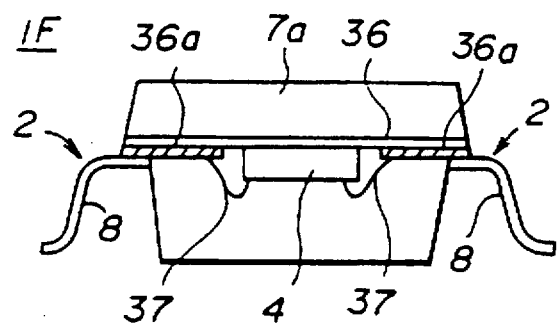

Next, a description will be given of a sixth embodiment of the semiconductor device according to the present invention, by referring to FIG. 12. In FIG. 12, those parts which are the same as those corresponding parts in FIGS. 7(A)–7(C) are designated by the same reference numerals, and a description thereof will be omitted.

In a semiconductor device 1F shown in FIG. 12, a substrate 36 having a pattern 36a formed thereon is arranged downwardly on the upper resin 7a, and the chip 4 is mounted on the surface of the substrate 36 having the pattern 36a. The chip 4 is bonded to inner ends of the pattern 36a by wires 37. When the resin is molded in this state, a part of the pattern 36a becomes exposed due to the difference in the sizes of the upper and lower resins 7a and 7b. The outer leads 8 are fixed to the exposed part of the pattern 36a by solder reflow, OLB, laser welding or the like.

Figure 13:
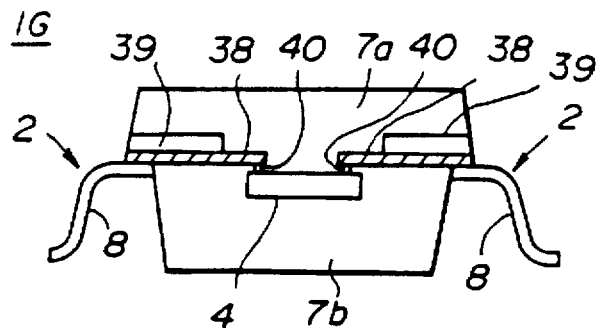

Next, a description will be given of a seventh embodiment of the semiconductor device according to the present invention, by referring to FIG. 13. In FIG. 13, those parts which are the same as those corresponding parts in FIGS. 7(A)–7(C) are designated by the same reference numerals, and a description thereof will be omitted.

In a semiconductor device 1G shown in FIG. 13, a film carrier 39 is mounted on a pattern 38 to prevent the pattern 38 from scattering. The chip 4 is bonded to the inner ends of the pattern 38 by bumps 40 in a hanging manner. When the resin is molded in this state, a part of the pattern 38 becomes exposed due to the difference in the sizes of the upper and lower resins 7a and 7b. The outer leads 8 are fixed to the exposed part of the pattern 38 by solder reflow, OLB, laser welding or the like.

Figure 14A:
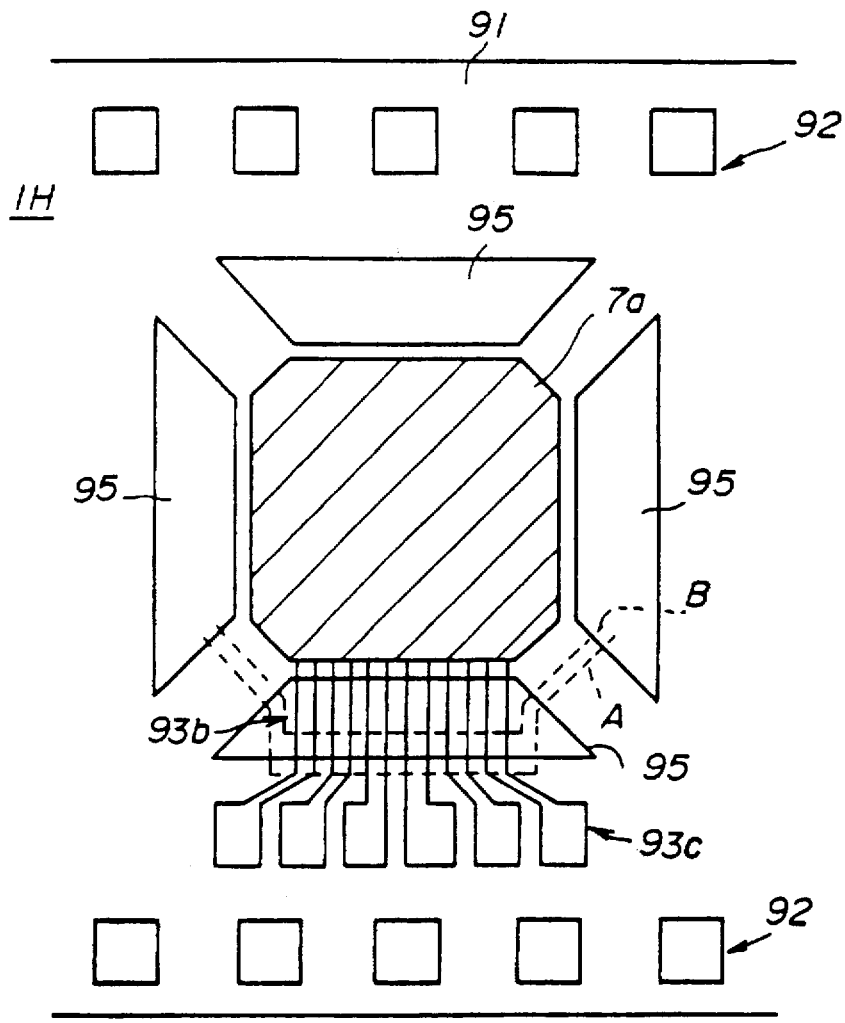
FIGS. 14(A) and 14(B) show an eighth embodiment of the semiconductor device according to the present invention in a plan view and a side view.
Figure 14B:
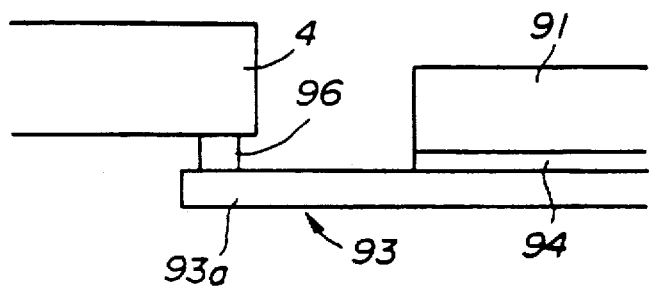

Next, a description will be given of an eighth embodiment of the semiconductor device according to the present invention, by referring to FIGS. 14(A) and 14(B). FIG. 14(A) shows a plan view and FIG. 14(B) shows a side view of the eighth embodiment of the semiconductor device. In FIGS. 14(A) and 14(B), those parts which are the same as those corresponding parts in FIGS. 7(A) 7(C) are designated by the same reference numerals and a description thereof will be omitted.

A semiconductor device 1H shown in FIG. 14(A) is shown as a tape carrier package. Sprocket holes 92 are provided along both sides of a tape carrier 91 of the lead member. For example, the tape carrier 91 has a thickness of 125 nm or 75 nm and is made of polyimide. Leads 93 having a predetermined pattern and made of a metal film are bonded at a part of the tape carrier 91 between the rows of sprocket holes 92 where one semiconductor device 1H is to be formed. As shown in FIG. 14(B), the lead 93 is bonded on the tape carrier 91 by an adhesive agent 94 having a thickness of 20 nm, for example. The metal film forming the leads 93 may be made of copper which is plated by tin, solder, gold and the like.

The lead 93 is made up of an inner lead 93a and an outer lead 93b which is formed through an outer lead hole 95 in the tape carrier 91. A pad 93c which is used at the time of the testing is formed on the tip end of the outer lead 93b.

In addition, as shown in FIG. 14(B), the tip end of the inner lead 93 of the lead 93 and the chip 4 are connected by a bump 96 which is made of gold or the like. An upper resin 7a and a lower resin 7b, which are not shown in FIGS. 14(A) and 14(B), are formed by molding the resin, and the package 7 is formed thereby. In this case, the lower resin 7b of the package 7 is made smaller than the upper resin 7a, similarly to the package 7 shown in FIG. 7(A). In addition, the wide parts 21 are formed in the zigzag or check-board arrangement on the upper resin 7a at the exposed part 8a, similarly to the wide parts 21 shown in FIG. 7(C).

In FIG. 14(B), the leads 93 are bonded on the tape carrier 91 by the adhesive agent 94. However, the leads 93 may be formed on the tape carrier 91 using techniques such as vapor deposition and etching.

The tape carrier 91 is cut along a dotted line A in FIG. 14(A) when the semiconductor device 1H is forwarded. Furthermore, the tape carrier 91 is cut along a dotted line B in FIG. 14(A) when the semiconductor device 1H is mounted. The outer leads 93b, after being cut along the dotted line B (and bent where applicable), form the outer leads 8.

Figure 15A:
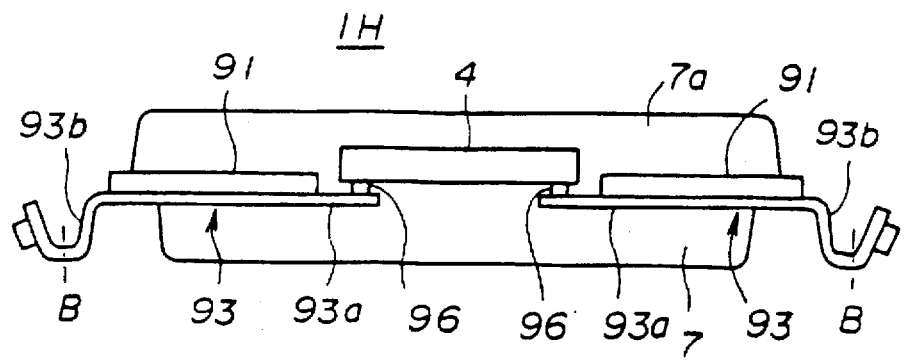
FIGS. 15(A) and 15(B) show a side view and a bottom view for explaining the forwarding of the eighth embodiment of the semiconductor device.

Next, a description will be given of the forwarding of the eighth embodiment of the semiconductor device shown in FIGS. 14(A) and 14(B), by referring to FIGS. 15(A) and 15(B). FIG. 15(A) shows the side view and FIG. 15(B) shows the bottom view of the eighth embodiment of the semiconductor device when it is forwarded.

Figure 15B:
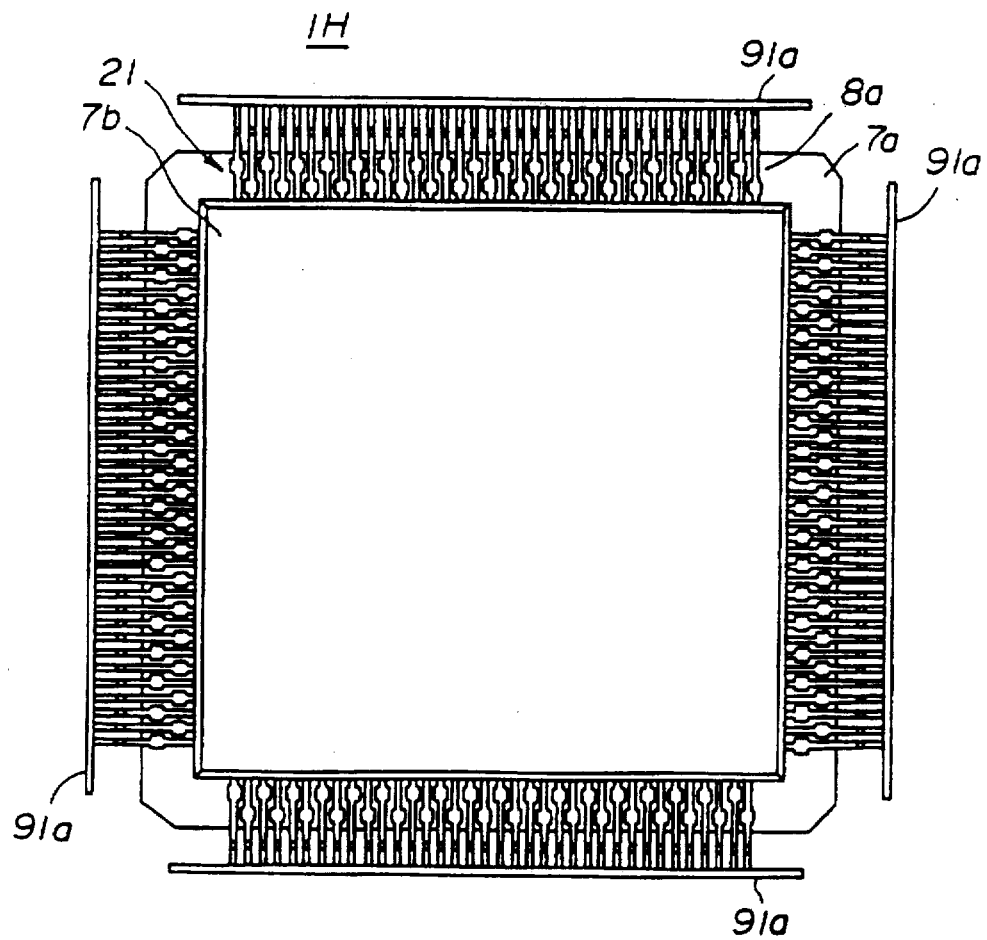

FIGS. 15(A) and 15(B) show the semiconductor device 1H which is obtained when the tape carrier 91 is cut along the dotted line A in FIG. 14(A) and the outer leads 93b are bent. The tip ends of the outer leads 93b are fixed to a tape 91a of the tape carrier 91. In other words, because the outer leads 93b are made of the metal film and are weak, the deformation of the outer leads 93b is prevented by forwarding the semiconductor device 1H in the state where the outer leads 93b are fixed to the tape 91a.

Figure 16A:
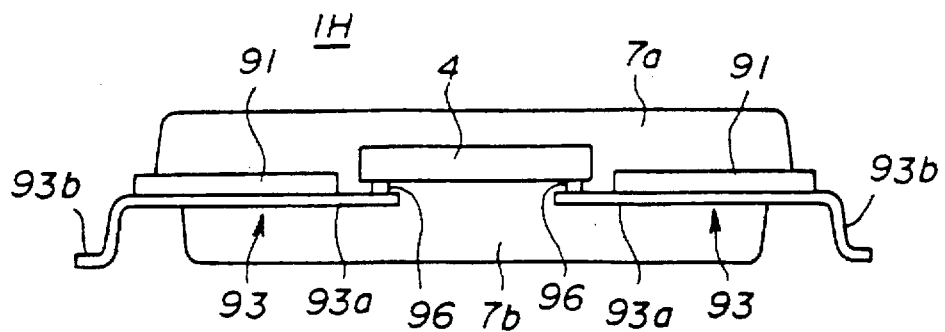
FIGS. 16(A) and 16(B) show a side view and a bottom view for explaining the mounting of the eighth embodiment of the semiconductor device.

Next, a description will be given of the mounting of the eighth embodiment of the semiconductor device shown in FIGS. 14(A) and 14(B), by referring to FIGS. 16(A) and 16(B). FIG. 16(A) shows the side view and FIG. 16(B) shows the bottom view of the eighth embodiment of the semiconductor device when it is mounted.

Figure 16B:
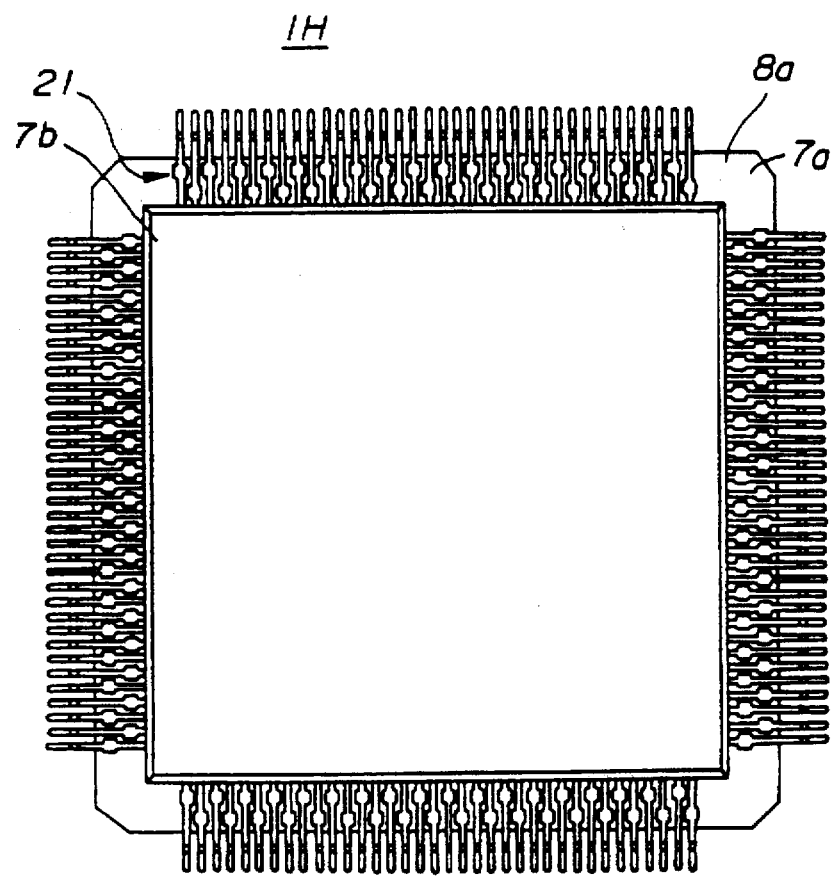

FIGS. 16(A) and 16(B) show the semiconductor device 1H which is obtained when the tape carrier 91 is cut along the dotted line B in FIGS. 14(A)–15(B). The semiconductor device 1H shown in FIGS. 16(A) and 16(B) is mounted on a circuit substrate or the like.

Figure 17:
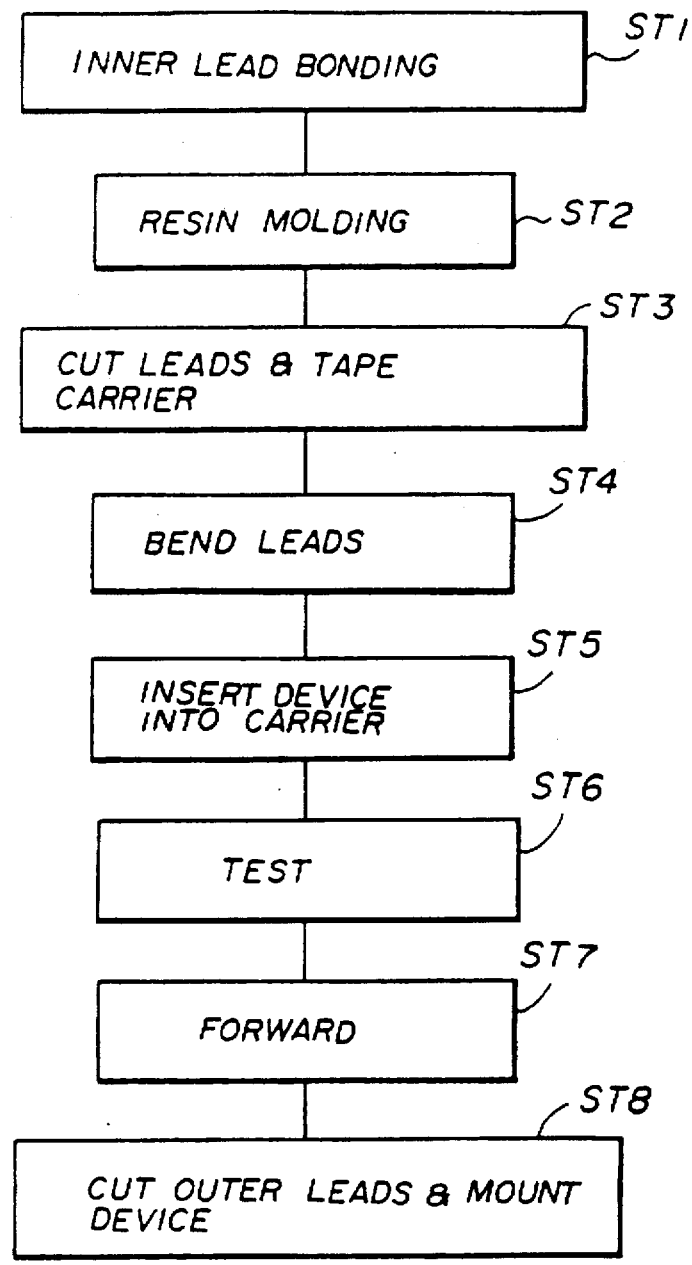
FIG. 17 is a flow chart for explaining the production steps of the eighth embodiment of the semiconductor device.

FIG. 17 is a flow chart for explaining the production steps of the eighth embodiment of the semiconductor device according to the present invention shown in FIGS. 14(A) and 14(B).

In FIG. 17, a step ST1 makes an inner lead bonding by bonding the chip 4 to the inner leads 93a on the tape carrier 91 by the bumps 96. Then, a step ST2 molds the resin. The semiconductor device 1H may be tested at this stage by contacting the probes of the testing equipment to the pads 93 on the tape carrier 91.

Thereafter, a step ST3 cuts a part of the outer leads 93b and the tape carrier 91 as indicated by the dotted line A in FIG. 14(A), and a step ST4 bends the outer leads 93b as shown in FIG. 15(A). The cutting of the step ST3 and the bending of the step ST4 may be carried out simultaneously.

A step ST5 inserts the semiconductor device 1H shown in FIG. 15(A) into a carrier which will be described later. A step ST6 tests the characteristic of the semiconductor device 1H by contacting the probes of the testing equipment to the wide parts 21 at the exposed part 8a, and the semiconductor device 1H is forwarded in a step ST7. A step ST8 cuts the outer leads 93b as indicated by the dotted line B in FIG. 14(A), and the semiconductor device 1H shown in FIGS. 16(A) and 16(B) is mounted on the printed circuit substrate or the like.

Figure 18A:
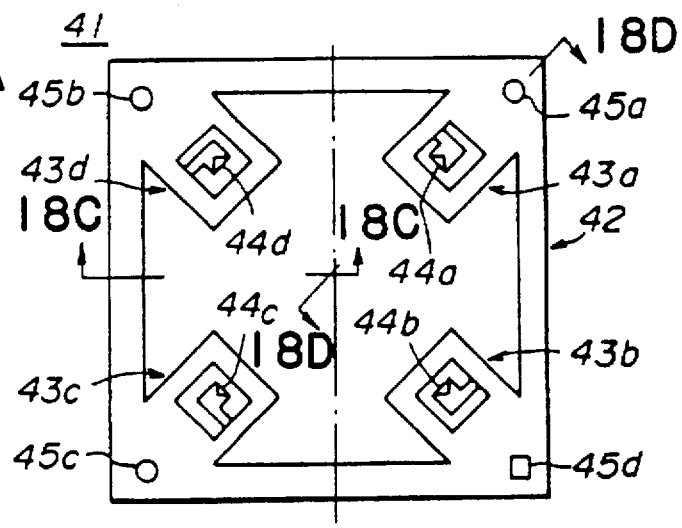
FIGS. 18(A), 18(B), 18(C) and 18(D) show an embodiment of a carrier according to the present invention which is used to transport the third embodiment of the semiconductor device in a plan view, a bottom view and cross sectional views.
Figure 18B:
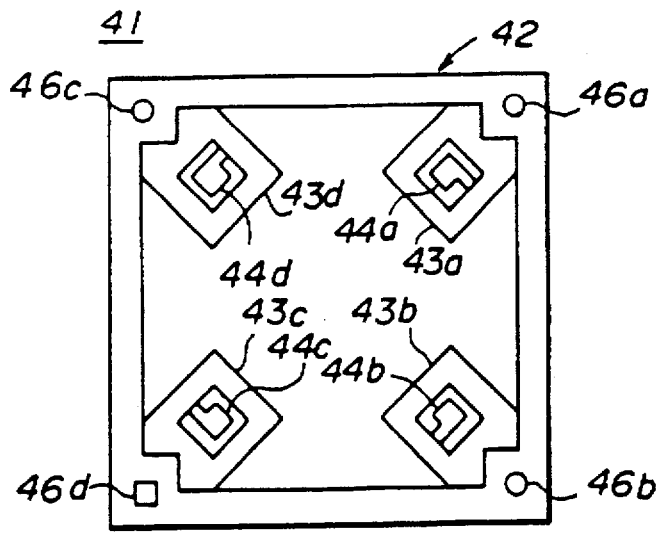
Figure 18C:
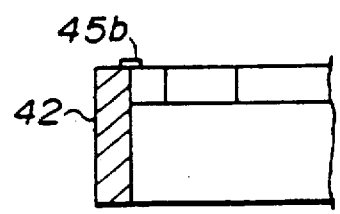
Figure 18D:
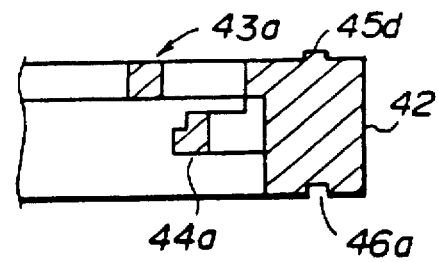

FIGS. 18(A)–18(D) show an embodiment of the carrier according to the present invention which is used when transporting the third embodiment of the semiconductor device 1C described above. FIG. 18(A) shows a plan view of the carrier, FIG. 18(B) shows a bottom view of the carrier, FIG. 18(C) shows a cross sectional view of the carrier along a line A–A' in FIG. 18(A), and FIG. 18(D) shows a cross sectional view of the carrier along a line B–B' in FIG. 18(A).

In FIGS. 18(A)–18(D), a carrier 4 has locking parts 43a through 43d which extend from respective upper four corners of a sidewall part 42 which has a hollow rectangular column shape. The locking parts 43a through 43d respectively have pushing claws 44a through 44d on the lower ends thereof.

In addition, circular projections 45a through 45c and a rectangular projection 45d are provided on the upper surface of the sidewall part 42 at the respective four corners thereof. On the other hand, circular recesses 46a through 46c and a rectangular recess 46d are provided on the lower surface of the side wall 42 at the respective four corners thereof. The projections 45a through 45d are formed in correspondence with the recesses 46a through 46d. In other words, it is possible to stack a plurality of carriers 41 by engaging the projections 45a through 45d of one carrier 41 with the corresponding recesses 46a through 46d of another carrier 41 which is stacked thereon.

Figure 19A:
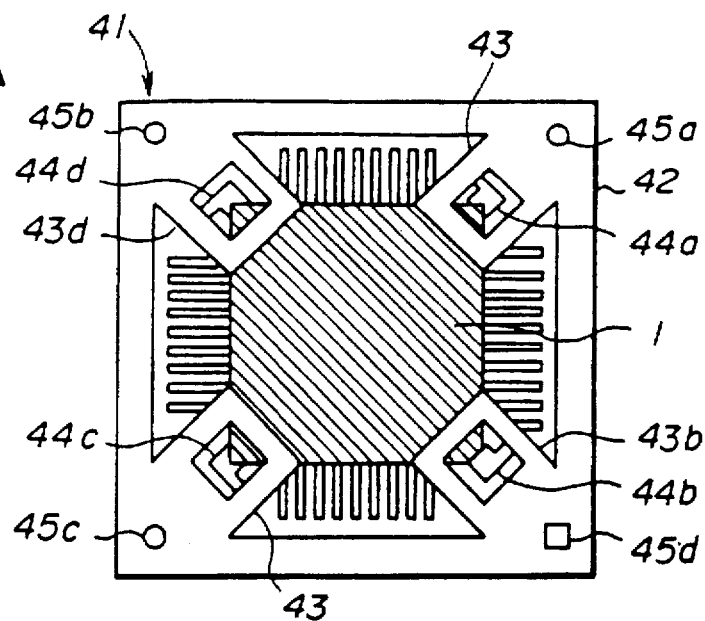
FIGS. 19(A), 19(B), 19(C) and 19(D) show the third embodiment of the semiconductor device inserted into the carrier shown in FIG. 18 in a plan view, a bottom view and cross sectional views.
Figure 19B:
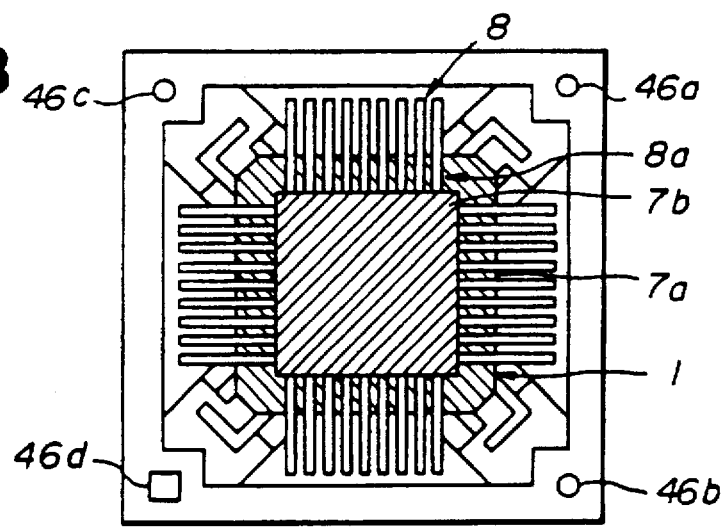
Figures 19C, 19D:
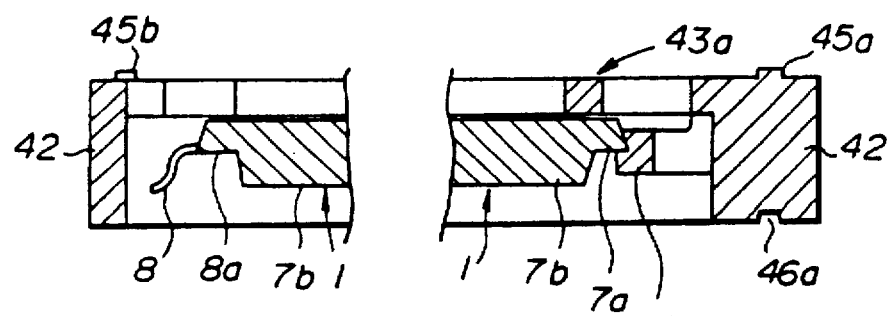

FIGS. 19(A)–19(D) show the carrier 41 having the semiconductor device 1C inserted therein. FIG. 19(A) shows a plan view of the carrier, FIG. 19(B) shows a bottom view of the carrier, and FIGS. 19(C) and (D) show cross sectional views of the carrier respectively corresponding to FIG. 18(C) and (D) described above.

In FIGS. 19(A)–(D), the four corners of the upper resin 7a of the semiconductor device 1H are fixed by the pushing claws 44a through 44d of the locking parts 43a through 43d of the carrier 41.

As shown in FIG. 19(A), at least a part of each side of the upper resin 7a becomes exposed in the plan view. In addition, the lower resin 7b and the exposed parts 8a can be seen in their entirety without being obstructed, as shown in FIG. 19(B). In other words, the state shown in FIG. 19(A) ensures that there is a sufficiently large part of the semiconductor device 1H to be pushed downwardly from above when testing and mounting the semiconductor device 1H. Furthermore, the state shown in FIG. 19(B) enables contact of the probes (socket) to the outer leads 8 at the exposed part 8a.

The sidewall part 42 protects the outer leads 8 of the semiconductor device 1H which is inserted into the carrier 41, and prevents the outer leads 8 from becoming deformed when the semiconductor device 1H is transported.

Figures 20A, 20B:
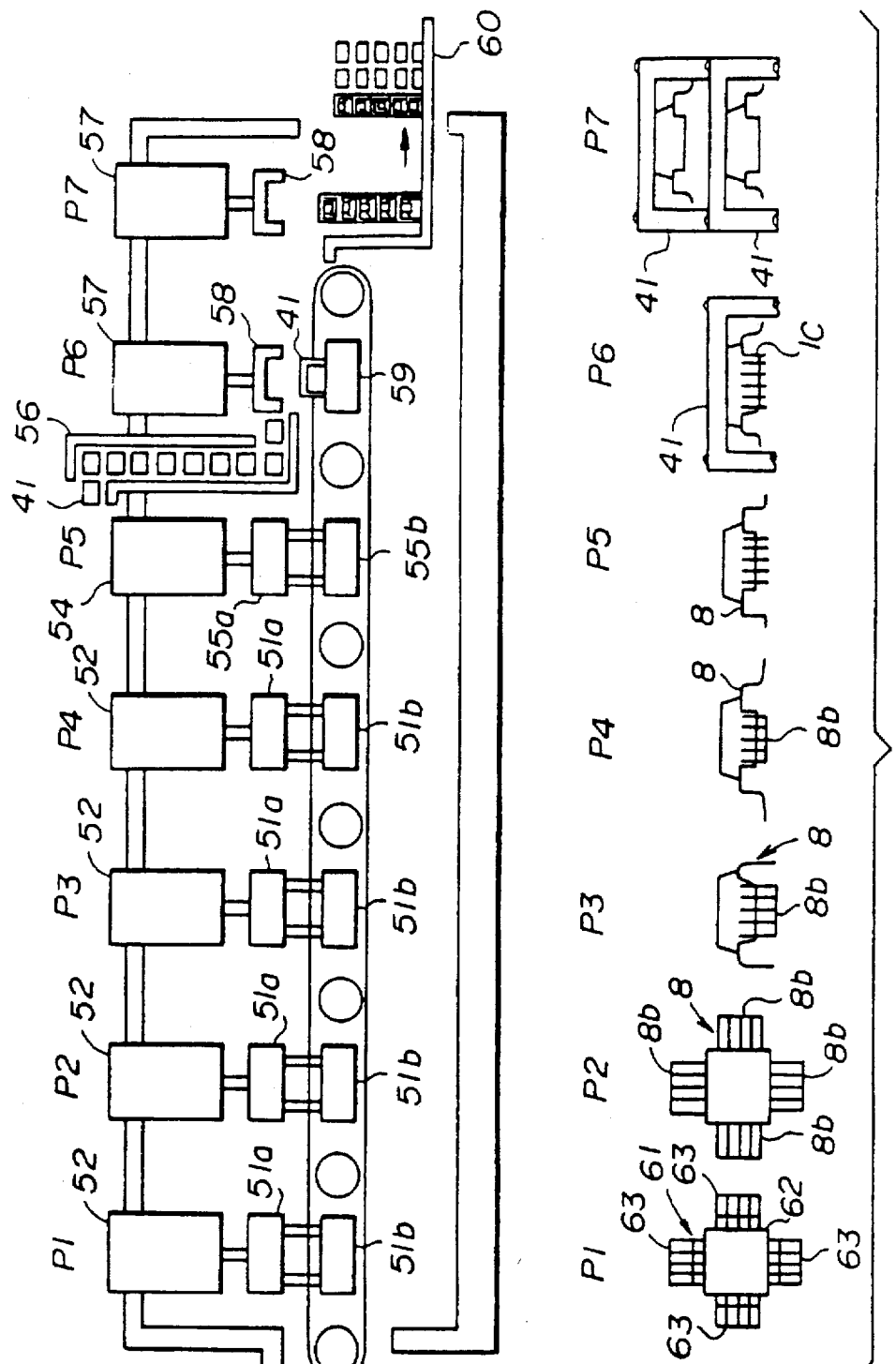
FIGS. 20(A) and 20(B) are diagrams for explaining an embodiment of a method of producing the semiconductor device according to the present invention.

On the other hand, a plurality of carriers 41 having the semiconductor device 1H inserted therein can be stacked as shown in FIGS. 20(A) and 20(B) when being transported, packed for forwarding or the like.

Next, a description will be given of an embodiment of a method of producing the semiconductor device according to the present invention, by referring to FIGS. 20(A) and 20(B). This embodiment of the producing method produces the semiconductor device 1C by inserting the semiconductor device 1C into the carrier 41. FIG. 20(A) shows a producing machine, and FIG. 20(B) shows the state of the semiconductor device 1C at various parts of the producing machine.

In FIG. 20(A), each of parts P1 through P4 includes die 51a and a press 52, and each die 51b is positioned within a belt conveyor 53. A part P5 includes a press 54, carrier combining parts 55a and 55b and a supply part 56 for supplying the carrier 41. In addition, parts P6 and P7 respectively include a driving part 57 and a hand 58 which holds the carrier 41 on a support 59. The part P7 is additionally provided with an ejecting part 58.

In FIGS. 20(A) and(B), a lead frame 61 is cut from a package 62 at the part Pi, and bars 63 are cut off at the part P2. The outer leads 8 are subjected to a first bending process at the part P3, and are then subjected to a second bending process at the part P4, so that the outer leads 8 have the approximate S-shape or the so-called gull-wing shape. Tip ends 8b of the outer leads 8 are cut off at the part P5, and the semiconductor device 1C is inserted into the carrier 41 at the part P6. The carrier 41 inserted with the semiconductor device 1C is stacked at the ejecting part 58 of the part P7.

Therefore, after the shaping of the outer leads 8 is completed, it is possible to immediately accommodate the semiconductor device 1C within the carrier 41 and prevent deformation of the outer leads 8.

FIGS. 20(A) and 20(B) show the production of the third embodiment of the semiconductor device 1C shown in FIG. 7. However, the production of the eighth embodiment of the semiconductor device 1H shown in FIGS. 14(A)–16(B) having the form of the tape carrier package may be produced similarly as described above.

Next, a description will be given of the forwarding and packing of the carrier having the semiconductor device inserted therein, by referring to FIGS. 21(A)–21(D).

Figure 21A:
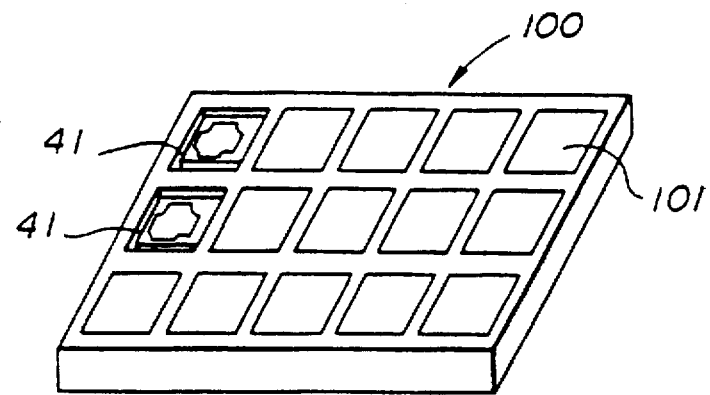
FIGS. 21(A), 21(B), 21(C) and 21(D) are diagrams for explaining the forwarding and packing of the carrier having the semiconductor device inserted therein.

FIG. 21(A) shows a case where a plurality of recesses 101 are formed in a tray 100. Each recess 101 has a shape and size slightly larger than those of the carrier 41. The carriers 41 are independently accommodated within the respective recesses 101 of the tray 100.

Figure 21B:
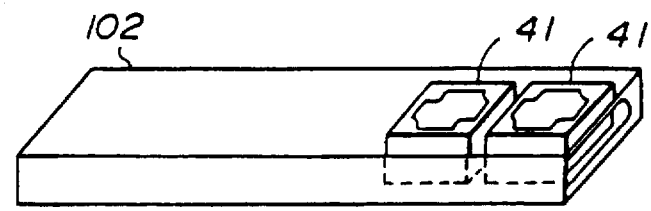

FIG. 21(B) shows a case where a plurality of carriers 41 are inserted into a hollow container 102. By forming the container 102 so that the container 102 is transparent at least in part, it becomes possible to visually confirm the state of the carriers 41 accommodated within the container 102.

Figure 21C:
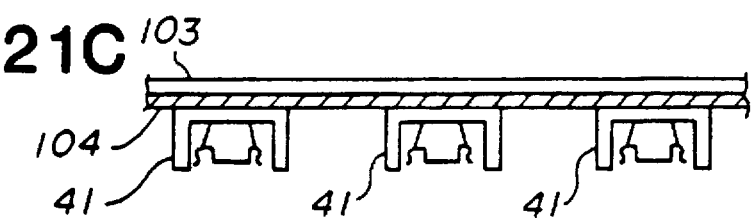

FIG. 21(C) shows a case where the top surface of each carrier is fixed to a base tape 103 via an adhesive agent 104. The carriers 41 are appropriately spaced apart on the base tape 103. Hence, it is possible to transport the carriers 41 in the form of a roll of the base tape 103, for example.

Figure 21D:
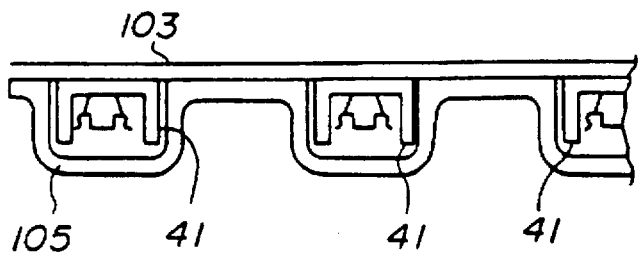

FIG. 21(D) shows a case where the carriers 41 are arranged at predetermined positions on the base tape 103 and each carrier 41 is fixed to the base tape 103 by an embossed paper tape 105, for example. In this case, it is also possible to transport the carriers 41 in the form of a roll of the base tape 103, for example.

Next, a description will be given of the plating process which forms a part of the production method, by referring to FIG. 22.

Figure 22:
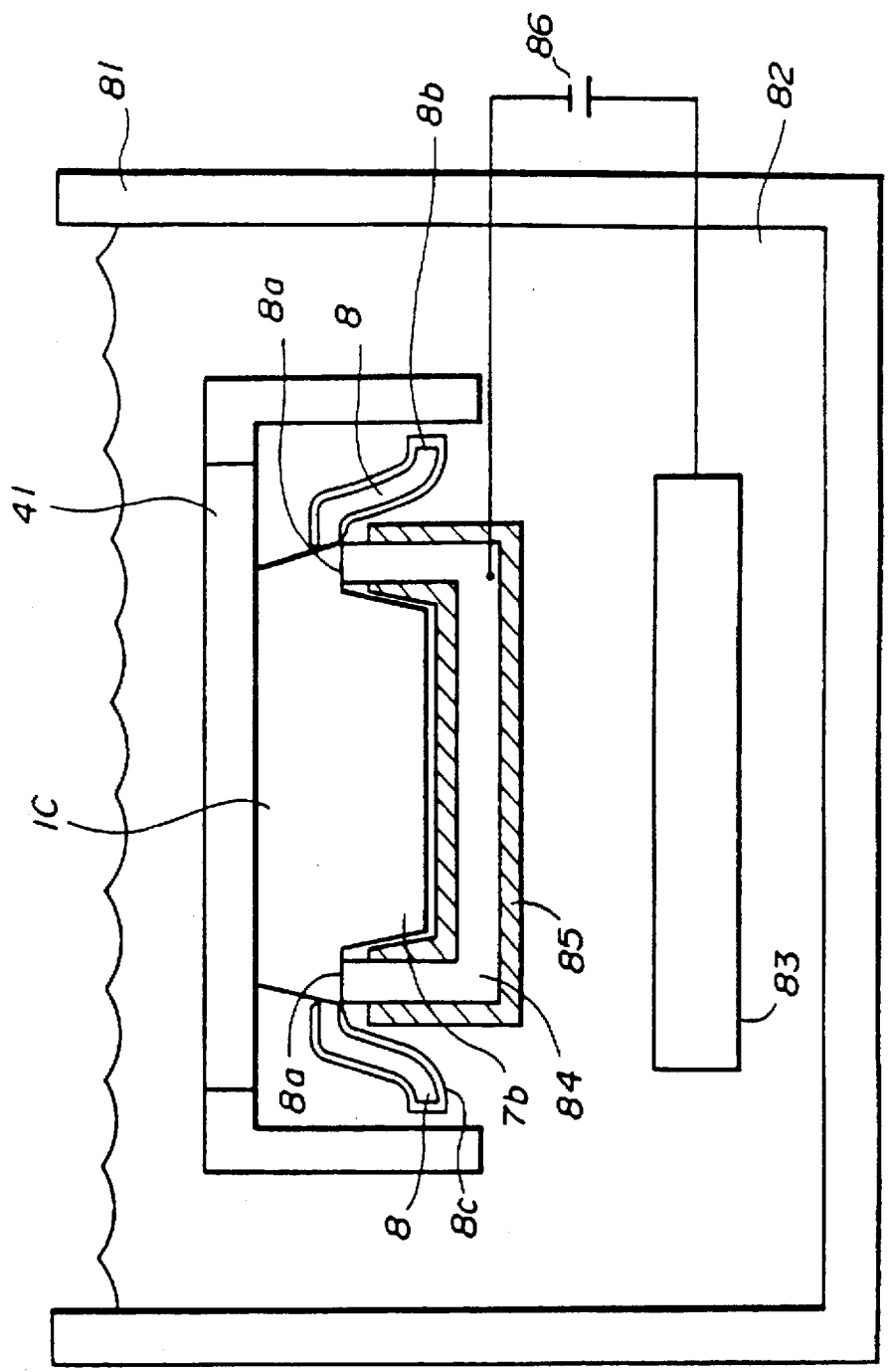
FIG. 22 is a diagram for explaining a plating process which forms a part of the production method.

In FIG. 22, a plating liquid 82 is filled within a plating tank 81, and an anode 83 and a cathode 84 are arranged within the plating liquid 82 which includes Sn, PbSn or the like, for example. The cathode 84 has an open-box shape so as to contact the entire exposed part 8a of the semiconductor device 1C which is to be subjected to the plating process. In addition, parts of the cathode 84 other than the contact part are covered by an insulator 85. A D.C. power source 86 is coupled to the anode 83 and the cathode 84.

The semiconductor device 1C which is carried on the carrier 41 is submerged into the plating liquid 82 within the plating tank 81. In this case, the lower resin 7b of the semiconductor device 1C fits into the open-box shaped cathode 84, and the cathode 84 and the exposed part 8a make contact.

When a voltage is applied across the anode 83 and the cathode 84 by the D.C. power source 86, a plated layer 8c made of Sn, PbSn or the like is formed on the outer leads 8. In other words, the plated layer 8c is formed on the external leads 8 by electroplating.

FIG. 22 shows the plating process which is carried out after the semiconductor device 1C is carried on the carrier 41, and according to this method of using the carrier 41, it is easier to transport the semiconductor device 1C into the plating tank 81. However, the plating process can also be carried out before the semiconductor device 1C is carried on the carrier 41. In this case, the package (upper resin 7a and/or lower resin 7b) is held by a robot or the like and is transported above the cathode 84 within the plating tank 81.

The plating process shown in FIG. 22 is a final plating process which is carried out after a pre-plating process using Ag, Au, Pb or the like is carried out with respect to the lead frame 2 during the production process of the semiconductor device 1C. However, no plating is made on the cut surface which is formed when the tip ends 8b of the outer leads 8 are cut when this final plating process is carried out. Hence, a pre-plating process may be carried out with respect to the cut surface, but such a pre-plating process is not essential. When the final plating process is carried out, the adherence of the plating material on the cut surface at the tip ends of the outer leads 8 is poorer than that of the other parts which have been subjected to the pre-plating process, however, the cut surface at the tip ends of the outer leads 8 help the generation of the solder fillet when mounting the semiconductor device 1C and no problems are caused thereby. For this reason, it is not essential to carry out the pre-plating process with respect to the cut surface of the tip ends of the outer leads 8.

On the other hand, if the lead frame 2 is not subjected to a plating process using Ag or the like, it is necessary to carry out a pre-plating process before the final plating process shown in FIG. 22, in order to improve the adherence of the plating material during the final plating process.

The pre-plating process in this case is carried out after the packaging of the upper and lower resins 7a and 7b, in a state where the bar 63 and the unwanted part at the tip ends 8b of the outer leads 8 are electrically connected, and an acid cleaning and the like is sufficiently carried out. In addition, an electroplating or an electroless plating (chemical plating) may be carried out after the cleaning.

Furthermore, the unwanted parts are cut off as shown in FIG. 20(B) and the semiconductor device 1C is carried out on the carrier 41 before carrying out the final plating process shown in FIG. 22.

In the description given above with reference to FIG. 22, the plating process including the pre-plating process employs the electroplating technique. However, it is also possible to employ the electroless plating (chemical plating) technique.

Therefore, the plating process which is carried out to ensure a positive mounting of the semiconductor device 1C on the substrate or the like can be carried out even after the outer leads 8 are bent, without applying an external force on the outer leads 8. As a result, it is possible to prevent deformation of the outer leads 8 and also prevent deterioration of the position accuracy of the outer leads 8.

Figure 23:
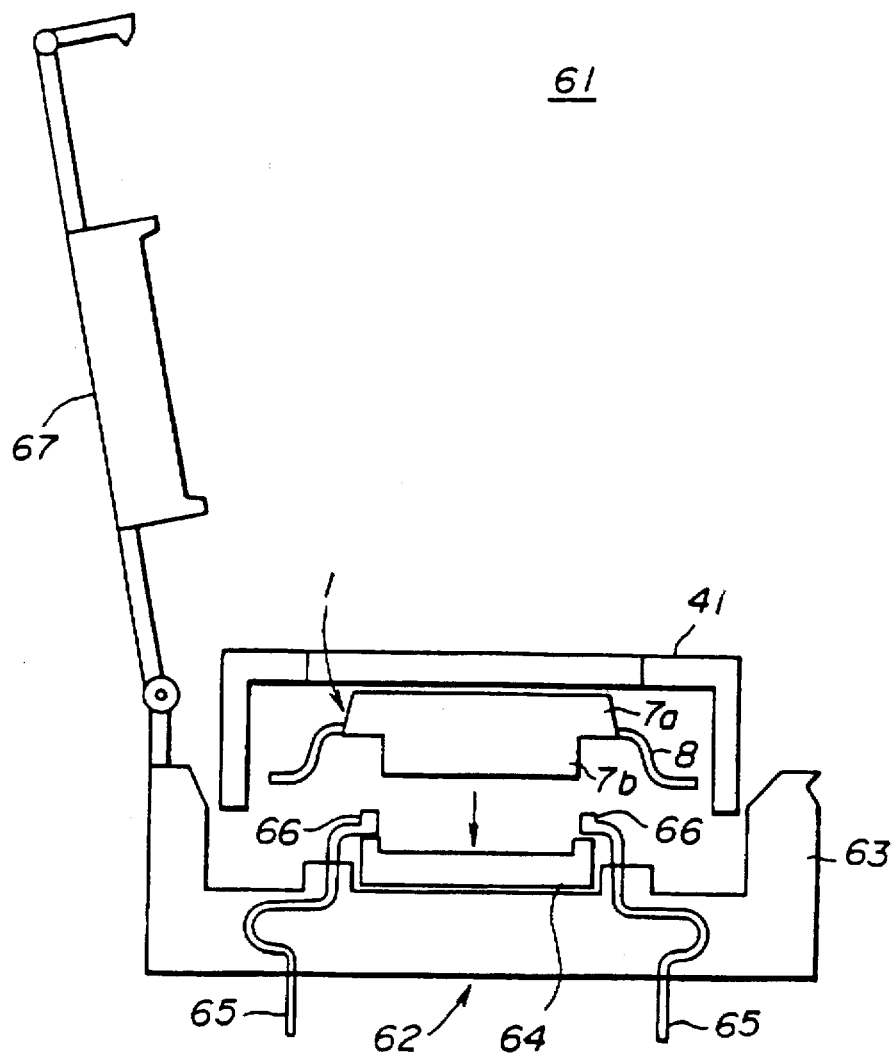
FIG. 23 is a side view in cross section showing a socket which is used in a third embodiment of the method testing the semiconductor device according to the present invention.

Next, a description will be given of a third embodiment of the method of testing the semiconductor device, by referring to FIGS. 23, 24(A) and 24(B). FIG. 23 shows a socket 61 which is used for the test, and FIGS. 24(A) and 24(B) are diagrams for explaining the operation of the socket 61 shown in FIG. 23.

In FIG. 23, a socket 61 which is used as a testing jig is made up of a body 62 which has a box shape slightly larger than the external size of the carrier 41. The carrier 41 is generally positioned by a side part 63 of the body 62. A base 64 for positioning the lower resin 7b of the semiconductor device 1C is provided at the bottom of the body 62. Probes 66 which are electrically connected to terminals 65 are provided in the periphery of the base 64 in correspondence with the outer leads 8 of the semiconductor device 1C. In addition, a lid 67 for pushing the upper resin 7a of the semiconductor device 1C is pivotally supported on the body 62.

Figure 24A:
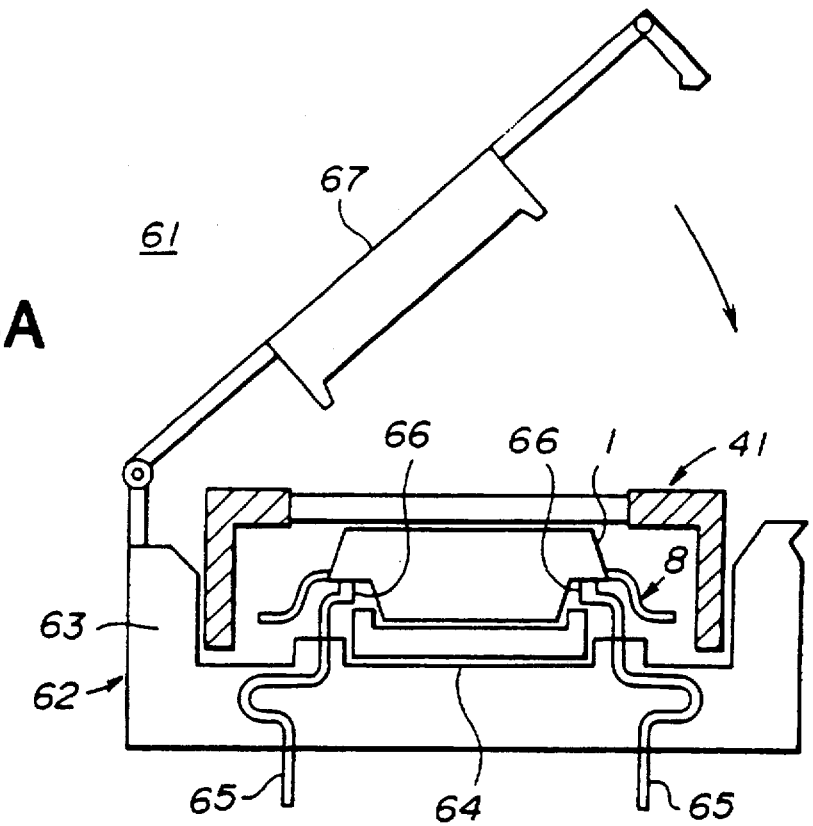
FIGS. 24(A) and 24(B) are diagrams for explaining the operation of the socket shown in FIG. 23.

In FIG. 24(A), the carrier 41 is generally positioned when the carrier 41 is inserted into the body 62, and in this state, the lower resin 7b of the semiconductor device 1C is placed on and is positioned by the base 64. In this state, the outer leads 8 make contact with the corresponding probes 66 at the exposed parts 8a shown in FIGS. 7(A)–7(C).

Figure 24B:
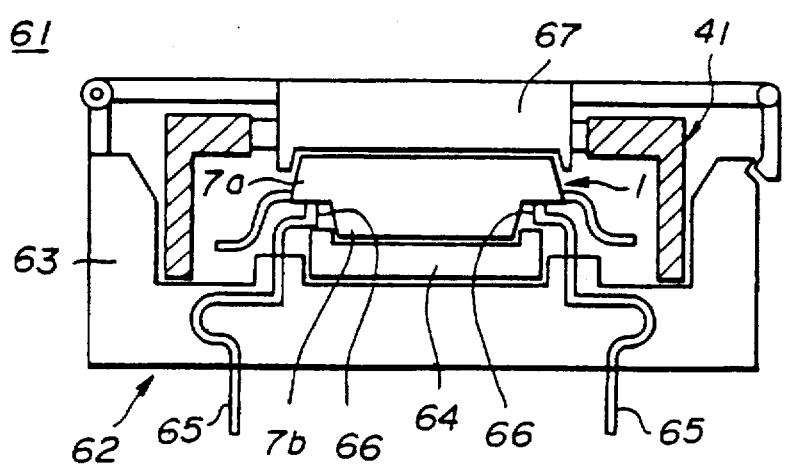

Then, as shown in FIG. 24(B), the upper resin 7a of the semiconductor device 1C is pushed by the closed lid 67 and is fixed within the body 62 so that it is possible to test the semiconductor device 1C.

Therefore, the semiconductor device 1C can be placed on and electrically connected to the socket 61 by simply placing the semiconductor device 1C into the body 62 in a state where the semiconductor device 1C is carried on the socket 41. Hence, it is possible to prevent the outer leads 8 from making contact with the socket 61 when the semiconductor device 1C is placed on the socket 61, and the deformation of the outer leads 8 is prevented when testing the semiconductor device 1C.

Next, a description will be given of a method of mounting the semiconductor device 1C, for example, on a substrate, by referring to FIGS. 25(A)–25(D).

Figure 25A:
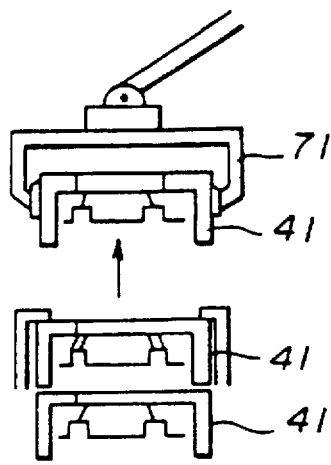
FIGS. 25(A), 25(B), 25(C) and 25(D) are diagrams for explaining a method of mounting the semiconductor device.
Figure 25B:
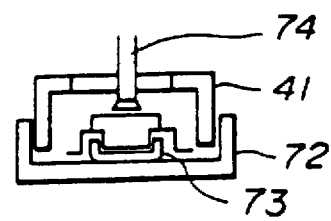

First, one of the stacked carriers 41 is lifted by a hand 71 as shown in FIG. 25(A), and is positioned and placed on a positioning support 72 shown in FIG. 25(B). The positioning support 72 has a box shape slightly larger than the external size of the carrier 41, and generally positions the carrier 41 placed thereon. The upper resin 7a of the semiconductor device 1C is pushed on a positioning base 73 of the positioning support 72 by a pushing part 74, so as to separate the semiconductor device 1C from the carrier 41. Hence, the lower resin 7b is placed on the positioning base 73 so as to position the semiconductor device 1C.

Figure 25C:
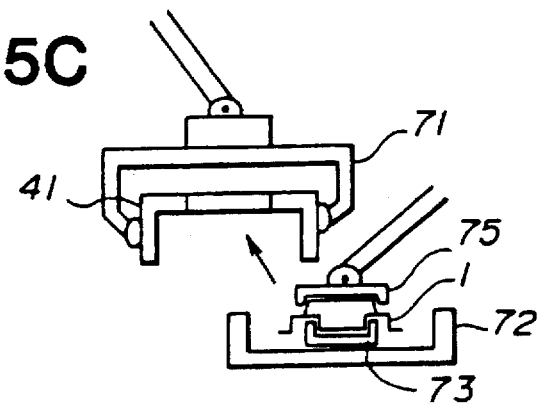
Figure 25D:
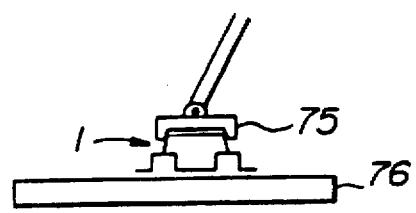

Then, only the empty carrier 41 is removed by the hand 71 as shown in FIG. 25(C), and the upper resin 7a is held by a hand 75. Furthermore, the semiconductor device 1C is placed at a predetermined position on a substrate 76 by the hand 75 as shown in FIG. 25(D), and the mounting of the semiconductor device 1C is completed by carrying out a solder reflow process or the like.

Accordingly, it is possible to prevent the outer leads 8 from touching the jig or the like also when mounting the semiconductor device 1C on the substrate 76. Thus, the deformation of the outer leads 8 can be prevented.

Figure 26:
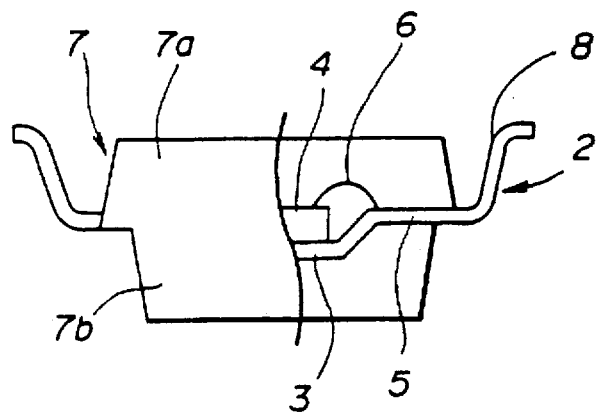
FIG. 26 is a ninth embodiment of the semiconductor device according to the present invention in a side view.

Next, a description will be given of a ninth embodiment of the semiconductor device according to the present invention, by referring to FIG. 26. In FIG. 26, those parts which are the same as those corresponding parts in FIGS. 7(A)–7(C) are designated by the same reference numerals, and a description thereof will be omitted.

In this embodiment, the outer leads 8 of a semiconductor device 1C' shown in FIG. 26 are bent in a direction opposite to those of the semiconductor device 1C shown in FIG. 7(A). Otherwise, the semiconductor device 1C' is the same as the semiconductor device 1C. It is of course possible to make the lower resin 7b of the package 7 larger than the upper resin 7a, as described above. In this case, the construction of the semiconductor device will be identical to that of the semiconductor device 1C shown in FIG. 7(A) except that the lower resin would have the size of the upper resin 7a shown in FIG. 7(A) and the upper resin would have the size of the lower resin 7b shown in FIG. 7(A).

According to this embodiment of the semiconductor device, there is an additional advantage in that the semiconductor device 1C' can be tested by contacting the probes to the outer leads 8 at the exposed part 8a in a state where the semiconductor device 1C' is mounted on the circuit substrate or the like.

Figure 27A:
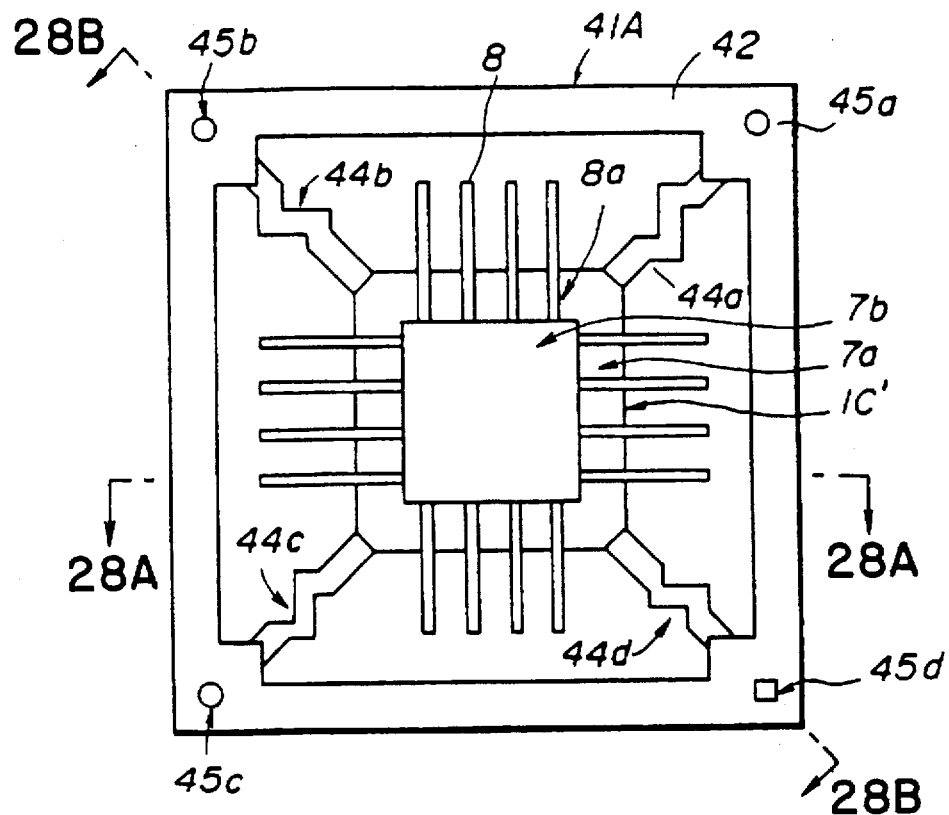
FIGS. 27(A) and 27(B) show the ninth embodiment of the semiconductor device into another embodiment of the carrier according to the present invention in a plan view and a bottom view.
Figure 27B:
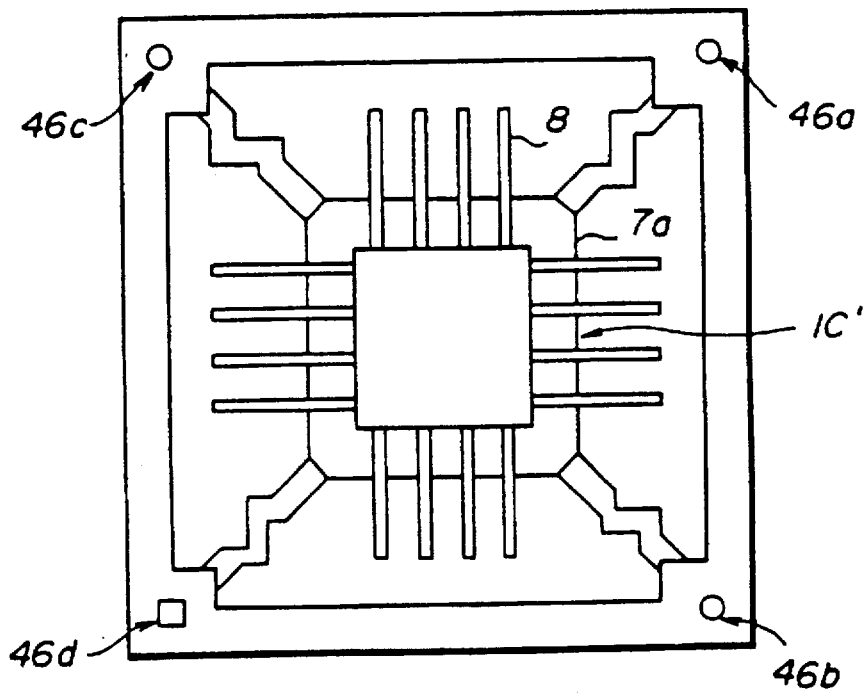

FIGS. 27(A) and 27(B) show another embodiment of a carrier having the semiconductor device 1C' shown in FIG. 26 inserted therein. FIG. 27(A) shows a plan view of a carrier 41A and FIG. 27(B) shows a bottom view of the carrier 41A. In FIGS. 27(A) and 27(B), those parts which are basically the same as those corresponding parts in FIGS. 19(A) and 19(B) are designated by the same reference numerals, and a description thereof will be omitted.

Figure 28A:
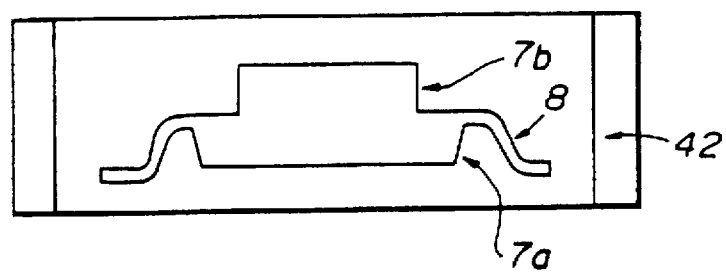
FIGS. 28(A) and 28(B) show cross sectional views respectively along a line e—e and a line f—f in FIG. 27(A)
Figure 28B:
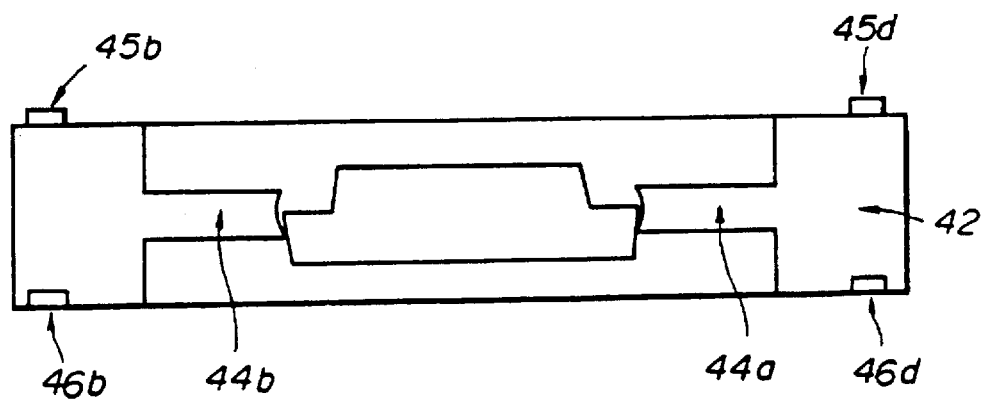

FIG. 28(A) shows a cross section of the carrier 41A taken along a line e–e' in FIG. 27(A), and FIG. 28(B) shows a cross section of the carrier 41A taken along a line f–f' in FIG. 27(A).

As may be seen from FIGS. 27(A)–28(B), the carrier 41A does not have locking parts 43a through 43d of the carrier 41 shown in FIGS. 19(A)–19(D). Instead, the carrier 41A supports the semiconductor device 1C' by the pushing claws 44a through 44d alone. Hence, both the upper resin 7a and the lower resin 7b of the semiconductor device 1C' becomes exposed in the bottom view and the top view of the carrier 41A, respectively.

Figure 29:
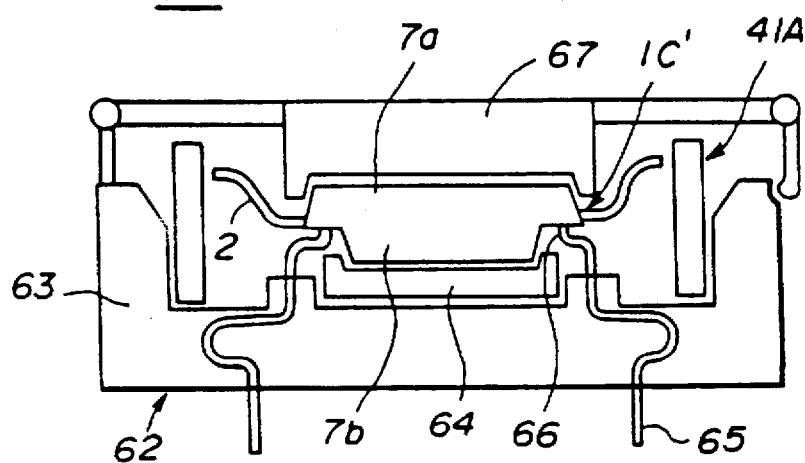
FIG. 29 is a side view in cross section showing a socket which is used in a fourth embodiment of the method of testing the semiconductor device according to the present invention.

Next, a description will be given of a fourth embodiment of the method of testing the semiconductor device, by referring to FIG. 29. FIG. 29 shows a socket which is used for the test. In FIG. 29, those parts which are the same as those corresponding parts in FIGS. 24(A) and 24(B) are designated by the same reference numerals, and a description thereof will be omitted.

In FIG. 29, a socket 61A which is used as a testing jig has a construction which is basically the same as the socket 61 shown in FIGS. 24(A) and 24(B). The difference between the socket 61 shown in FIGS. 24(A) and 24(B) is that in FIG. 29 the outer leads 8 of the semiconductor device 1C' curve upwardly within the carrier 41A.

Figure 30:
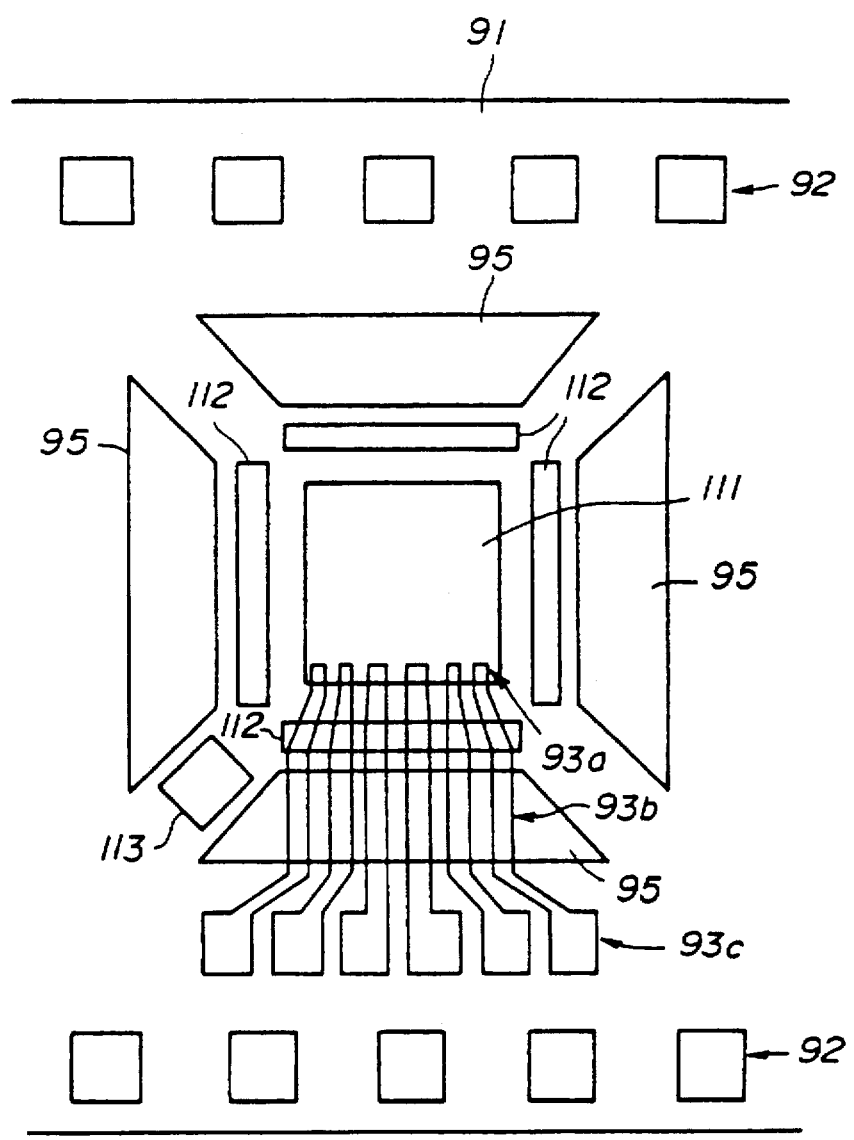
FIG. 30 shows a tape carrier in a state before a semiconductor chip is mounted thereof, for explaining another embodiment of the method of producing the semiconductor device according to the present invention.

Next, a description will be given of a resin molding process with respect to the tape carrier 91 shown in FIGS. 14(A) and 14(B), by referring to FIG. 30. FIG. 30 shows the tape carrier 91 before the chip 4 is mounted thereof. In FIG. 30, those parts which are the same as those corresponding parts in FIG. 14(A) are designated by the same reference numerals, and a description thereof will be omitted.

In FIG. 30, an opening 111 is provided at a position where the chip 4 is to be mounted. First holes 112 are provided along each side of the opening 111, so as to enable upward and downward flow of the resin at the time of the molding. In addition, a second hole 113 is provided at one position between two adjacent outer lead holes 95, to enable flow of the resin to upper and lower gates of the metal die which will be described later.

Figure 31A:
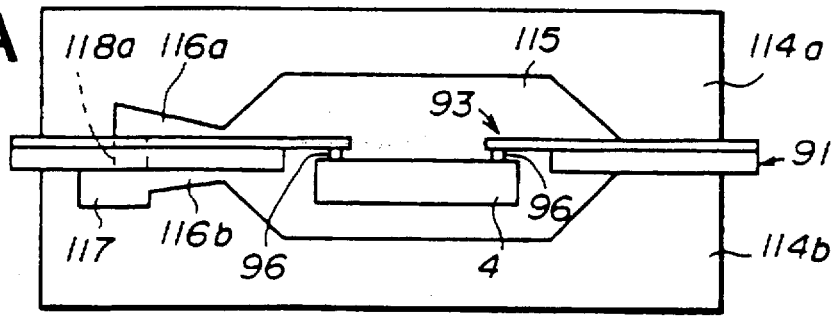
FIGS. 31(A), 31(B) and 31(C) are diagrams for explaining a general resin molding of the tape carrier.
Figure 31B:
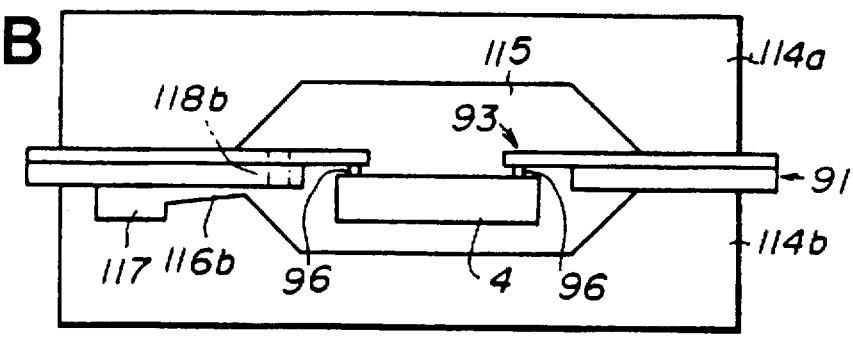
Figure 31C:
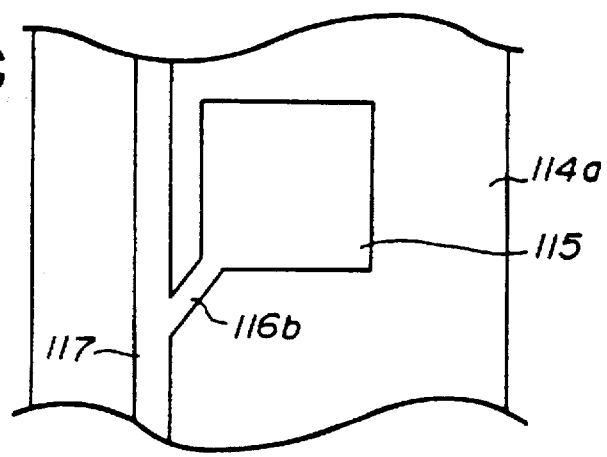

FIGS. 31(A)–31(C) are diagrams for explaining the general resin molding process for the tape carrier. In FIG. 31(A), the tape carrier 91 is positioned in a cavity 115 which is formed by an upper metal die 114a and a lower metal die 114b. The resin is injected to the cavity 115 of the lower metal die 114b via a runner 117 and a lower gate 116b shown in FIG. 31(C). In this case, a communication hole 118a is formed in the tape carrier 91, and the molding is carried out by supplying the resin from the runner 117 to an upper gate 116a of the upper metal die 114a via the communication hole 118a.

FIG. 31(B) shows a case where no upper gate is provided in the upper metal die 114a. In this case, a communication hole 118b is formed at a part of the tape carrier 91 located within the cavity 115, and the molding is carried out by supplying the resin within the cavity 115.

In either case, the molding is carried out by supplying the resin to the upper part of the cavity by forming the communication hole 118a or 118b in the tape carrier 91. However, when the sizes of the upper and lower resins 7a and 7b of the package 7 are different as shown in FIG. 7(A), for example, problems occur. First, in the case shown in FIG. 31(A), the mark of the upper gate 116a or the lower gate 116b will remain at the exposed part 8a of the upper resin 7a if the size of the cavity 115 is simply made different at the top and bottom. On the other hand, in the case shown in FIG. 31(B), the formation of the communication hole 118b will be limited by the size of the chip 4, and the molding process will be difficult to carry out.

Figure 32A:
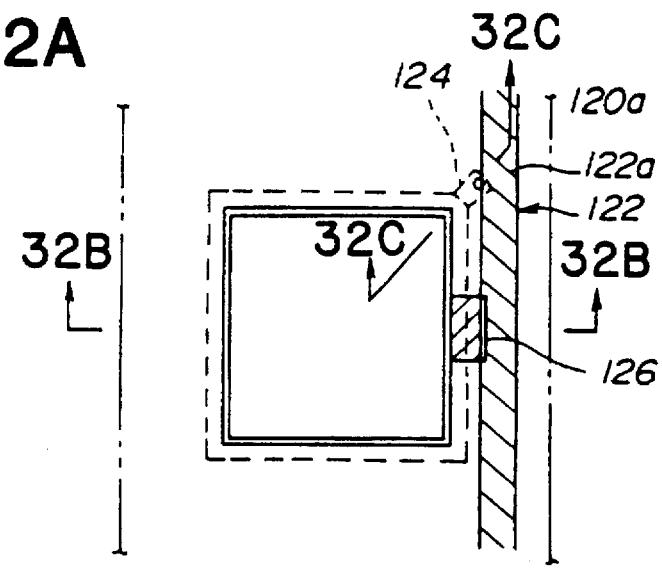
Figure 32B:
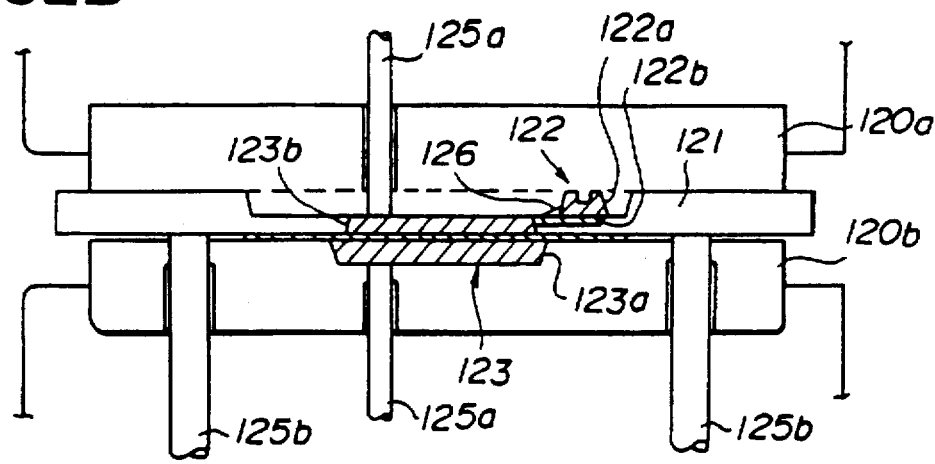
Figure 32C:
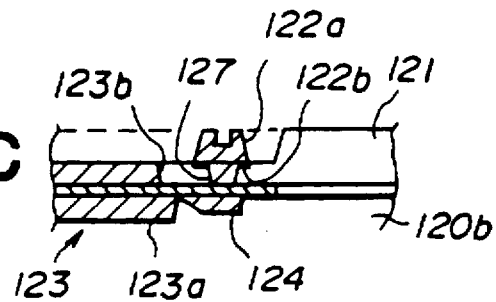

FIGS. 32(A)–32(C) are diagrams for explaining a resin molding of the tape carrier 91 shown in FIG. 30 according to this embodiment of the method of producing the semiconductor device. FIG. 32(A) is a plan view of a metal die which is used for the resin molding, FIG. 32(B) shows a cross section along a line A–A in FIG. 32(A), and FIG. 32(C) shows a cross section along a line B–B in FIG. 32(A).

In FIGS. 32(A)–32(C), a palette 121 is interposed between an upper metal die 120a and a lower metal die 120b. An upper runner 122a for supplying melted resin is formed at a part (upper gate which will be described later) of the upper metal die 120a making contact with the palette 121. In addition, the lower metal die 120b includes a recess 123a which forms the cavity 123, and a lower gate 124 which communicates to the recess 123a. Rods 125a and 125b are used for separating the upper and lower metal dies 120a and 120b after the resin molding.

The palette 121 includes an opening 123b which forms the cavity 123, a lower runner 122b which forms the runner 122 together with the upper runner 122a, and an upper gate 126 which communicates the opening 123b and the lower runner 122b. In other words, the cavity 123 is formed by the opening 123b of the palette 121 and the recess 123a of the lower metal die 120b which contacts the upper metal die 120a. The recess 123a forms the upper resin 7a, and the opening 123b forms the lower resin 7b. In addition, as shown in FIG. 32(C), a communication hole 127 is formed in the palette 121 to communicate the upper runner 122a to the lower gate 124 of the lower metal die 120b.

Figure 33A:
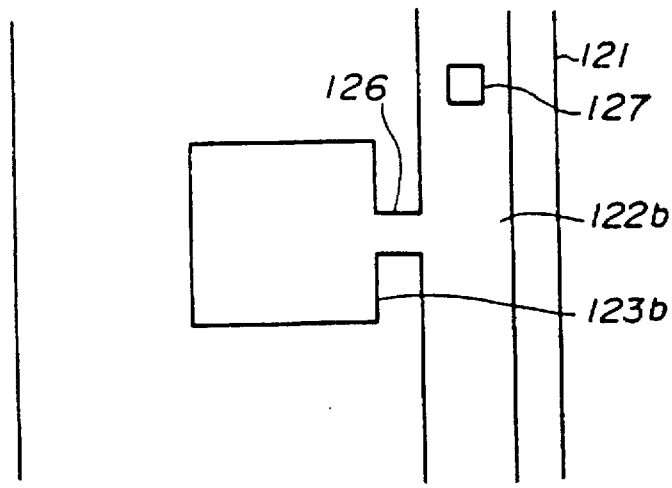
FIGS. 33(A) and 33(B) are diagrams for explaining a gate shown in FIG. 32.
Figure 33B:
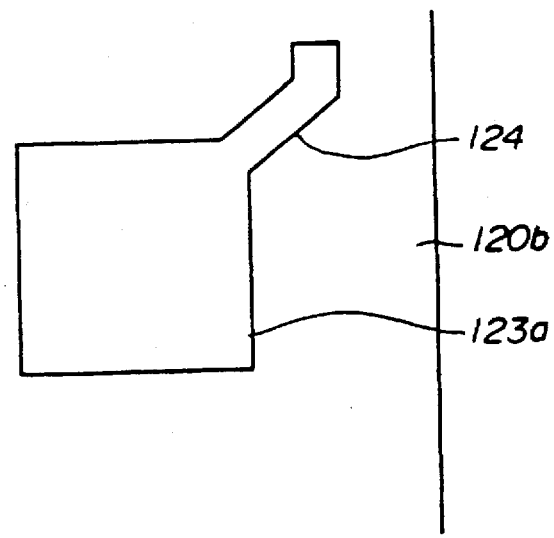

FIGS. 33(A)–33(C) are diagrams for explaining the gate shown in FIGS. 32(A)–32(C). FIG. 33(A) shows a plan view of the palette 121, and FIG. 33(B) shows a plan view of the lower metal die 120b. As shown in FIGS. 33(A) and 33(B), the lower runner 122b and the opening 123b of the palette 121 communicate at the upper gate 126, and the communication hole 127 of the lower runner 122b communicates to the lower gate 124 of the lower metal die 120b. It is of course possible to provide the runner 123 in only the palette 121 or in only the upper metal die 120a.

By positioning the tape carrier 91 shown in FIG. 30 within the cavity 123 using the palette 121 described before and injecting the resin from the runner 122, the resin flows to the lower gate 124 from the communication hole 127 of the palette 121 via the second hole 113 of the tape carrier 91. Furthermore, the resin within the cavity 123 flows into the recess 123a via the first holes 112 and flows to the upper gate 126. Hence, the resin molding process can be carried out smoothly in a satisfactory manner.

Therefore, in order to form the upper gate 126 and the lower gate 124 in the recess 123a and the opening 123b which have mutually different shapes and form the cavity 123, the palette 121 is interposed between the upper metal die 120a and the lower metal die 120b. As a result, it is possible to independently form the upper resin 7a and the lower resin 7a of the package 7. In addition, it is possible to easily carry out the resin molding process without forming the mark of the gate at the exposed part 8a.

Of course, the upper and lower metal dies 120a and 120b may be reversed in FIGS. 31(A)-32(C).

There are semiconductor elements which generate heat during operation, and it is necessary to efficiently cool such semiconductor elements. For this reason, there is a known semiconductor device having a radiator member such as a radiator fin for cooling the semiconductor elements, and the radiator member is provided on a package which encapsulates the semiconductor elements. It is desirable that the radiator member has a high radiator characteristic from the point of view of its function, and it is desirable that the radiator member can be made in a simple manner and at a low cost from the point of view of production.

On the other hand, there is strong demand to realize a thin semiconductor device, and the semiconductor device having the radiator member is no exception.

Figure 34:
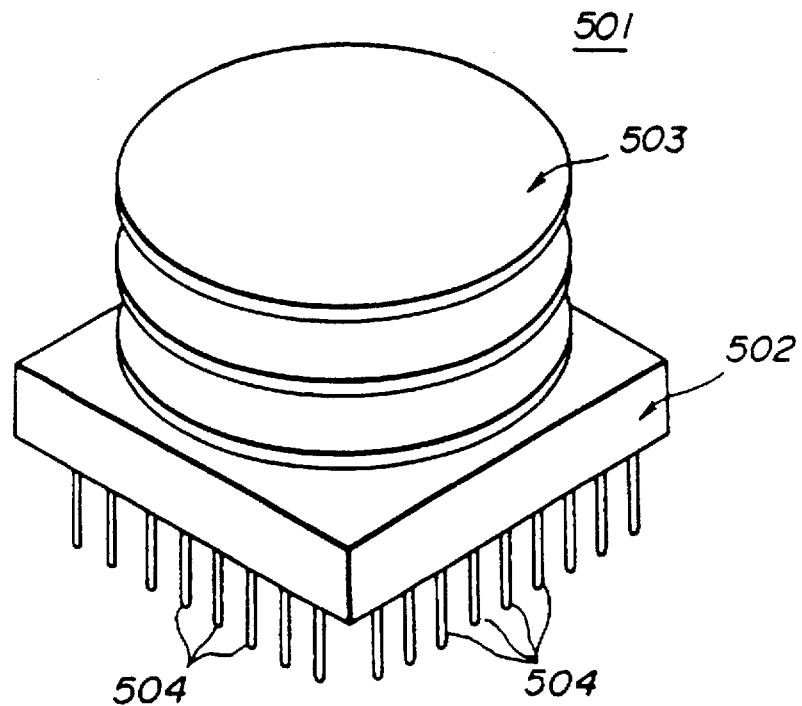
FIGS. 34 and 35 respectively are a perspective view and a side view showing an example of a conventional semiconductor device having a radiator member.
Figure 35:
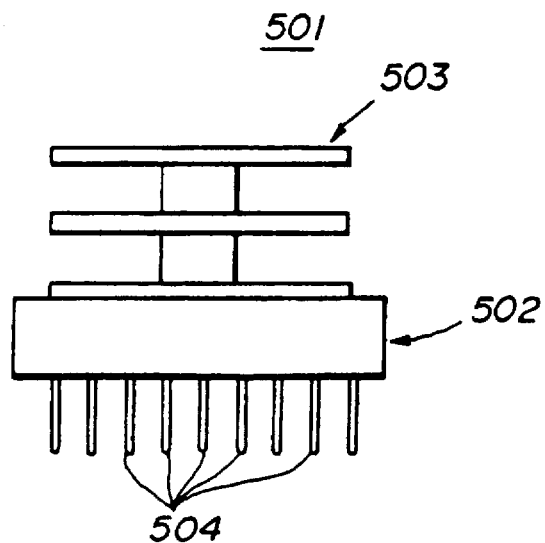

FIGS. 34 and 35 show an example of a conventional semiconductor device having a radiator member. A semiconductor device 501 shown in FIGS. 34 and 35 generally includes a package 502 and radiator fins 503. The package 502 is made of a resin, and the radiator fins 503 are made of a metal having a satisfactory radiator efficiency.

The package 502 is molded from the resin to encapsulate the semiconductor elements, and the semiconductor elements are protected by this package 502. A plurality of leads 504 extend from the package 502. The leads 504 are connected to the semiconductor elements within the package 2, and the exposed leads 504 connect to a circuit substrate or the like when the semiconductor device 501 is mounted.

The radiator fins 503 have a shape with a large surface area as shown so as to improve the radiator efficiency. An adhesive agent is used to mount the radiator fins 503 on the package 502. The adhesive agent is made of an epoxy system resin having a satisfactory thermal conduction.

In other words, the pin grid array package described above was generally used as the package structure having the improved radiator characteristic. However, due to the recent trend to employ the surface mounting, there are demands to realize a surface mounting type package having an improved radiator efficiency. In addition, there are also demands to reduce the thickness of the semiconductor device, and it is thus desirable to improve the radiator characteristic without the use of the bulky radiator fins 503.

Figure 36:
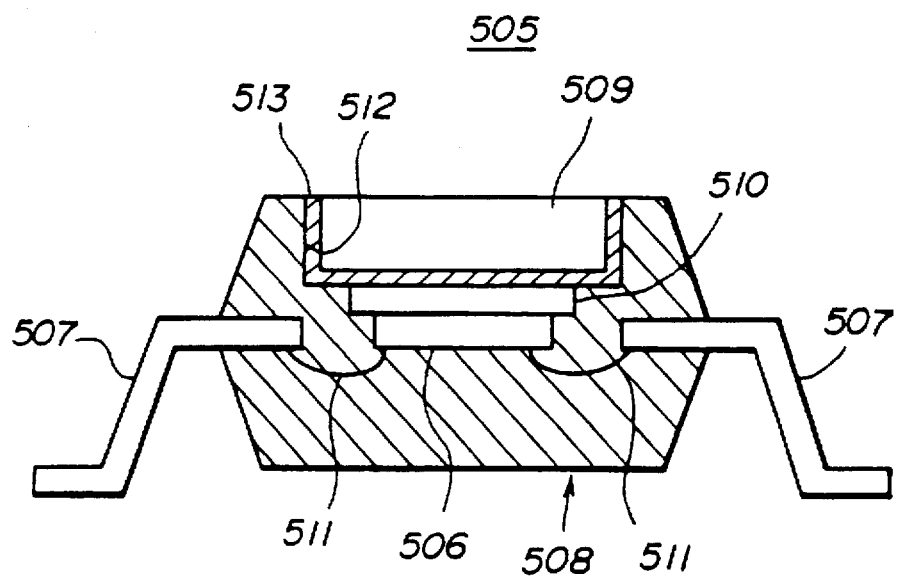
FIG. 36 is a side view in cross section showing another example of the conventional semiconductor device having a heat radiator structure.

FIG. 36 shows another example of the conventional semiconductor device which was developed to satisfy the above described demands. A semiconductor device 505 shown in FIG. 36 generally includes a semiconductor chip 506, leads 507, a package 508, a radiator plate 509, and a stage 510. The semiconductor chip 506 is die-bonded on the lower surface of the stage 510, and the semiconductor chip 506 and the leads 507 are connected by Au wires 511. Outer lead parts of the leads 507 extend outside the package 508 which is made of a resin, and are formed into a gull-wing shape, for example, to suit surface mounting of the semiconductor device 505. The package 508 encapsulates the semiconductor chip 506, inner lead parts of the leads 507, the stage 510 and the like. In addition, a cavity 512 is formed on top of the package 508. The radiator plate 509 is fixed within the cavity 512 by an adhesive agent 513 having a high thermal conductivity.

However, according to the semiconductor device 505, a molding process is carried out to expose the top surface of the stage 510 within the cavity 512 so as to improve the radiator characteristic. In addition, the exposed stage 510 and the radiator plate 509 are connected directly through the adhesive agent 513. For this reason, it is necessary to use metal dies having a high precision and to form the lead frame with a high accuracy in order to carry out the molding process so that the top surface of the stage 510 becomes exposed within the cavity 512. Therefore, there are problems in that the production process becomes troublesome to perform and that the production cost becomes relatively high.

On the other hand, the radiator plate 509 must be fixed within the cavity 512 after the molding process is completed. But in a state where the stage 510 is exposed within the cavity 512 after the molding process, there is a possibility of moisture entering within the package 508 from the boundary part between the stage 510 and the package 508. If moisture enters within the package 508, this moisture generates vapor during each of the various heating processes which are carried out after the molding process. As a result, there is a problem in that the generation of the vapor causes cracking or breaking of the package 508 and greatly deteriorates the reliability of the semiconductor device 505.

Next, a description will be given of a tenth embodiment of the semiconductor device according to the present invention, in which the problem of the conventional semiconductor device 505 is eliminated.

Figure 37:
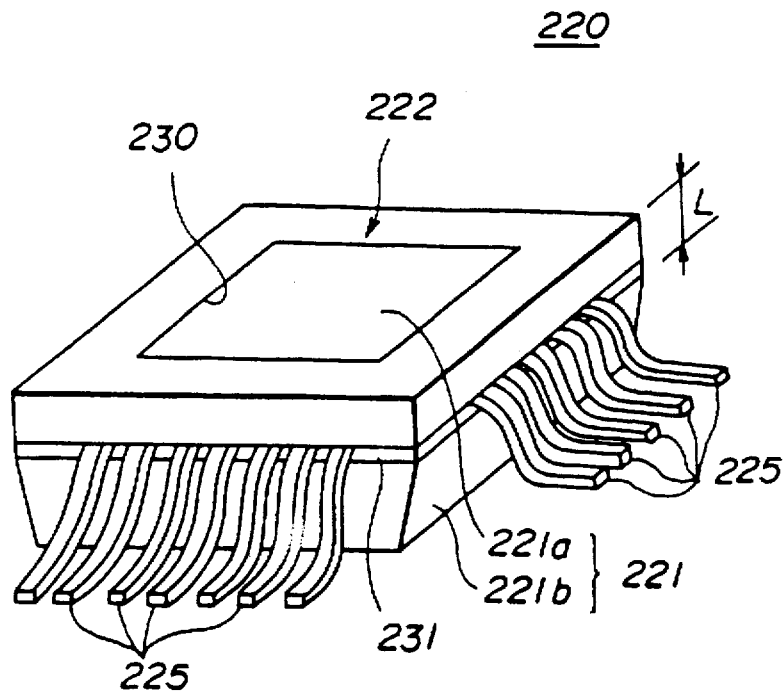
FIG. 37 is a perspective view showing a tenth embodiment of the semiconductor device according to the present invention.
Figure 38:
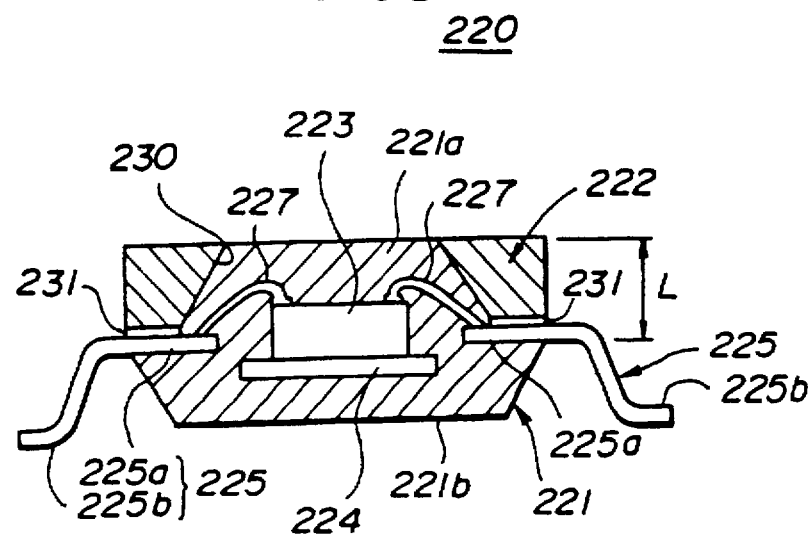
FIG. 38 is a side view in cross section showing the tenth embodiment of the semiconductor device.

FIGS. 37 and 38 respectively are a perspective view and a side view in cross section of the tenth embodiment of the semiconductor device. A semiconductor device 220 shown in FIGS. 37 and 38 generally includes a package 221 and a radiator member 222. The radiator member 222 is made of a material having a thermal conductivity higher than that of the package 221.

The package 221 is formed from an epoxy resin, for example, and encapsulates a semiconductor chip 223, a stage 224 and inner leads 225a of leads 225. That is, the package 221 is the so-called surface mounting type package. The semiconductor chip 223 is die-bonded on the stage 224 and is resin-encapsulated, so that the stage 224 is completely embedded and encapsulated within the package 221 as shown in FIG. 38. Accordingly, compared to the conventional semiconductor device 505 shown in FIG. 36, it is possible to positively prevent moisture from entering within the package 221 by the structure of the package 221. Even if the package 221 is subjected to a heating process thereafter, it is possible to suppress the generation of vapor and accordingly prevent the package 221 from cracking or breaking. In other words, it is possible to improve the reliability of the semiconductor device 220.

The semiconductor chip 223 which is arranged on the stage 224 is connected to the inner leads 225a of the leads 225 by wire-bonding. On the other hand, outer leads 225b of the leads 225 extend outside the package 221 so as to enable connection with a circuit substrate or the like when mounting the semiconductor device 220 on the circuit substrate or the like.

Figure 39:
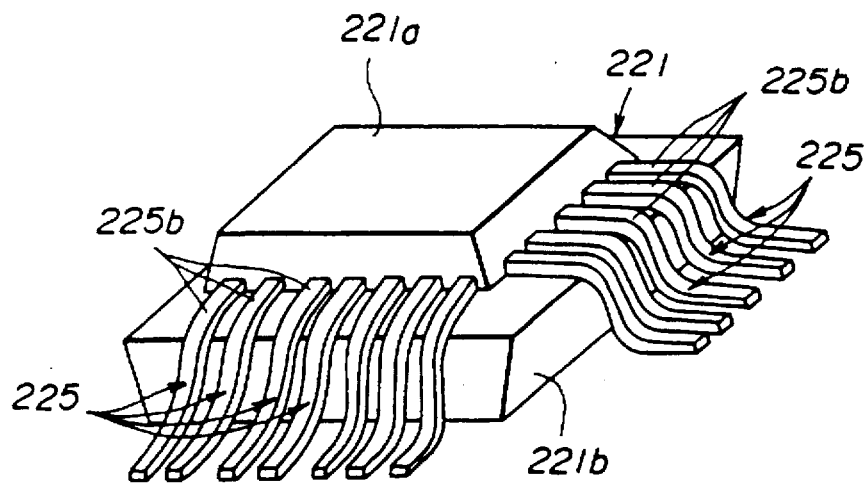
FIG. 39 is a perspective view showing the tenth embodiment of the semiconductor device with a radiator member removed.

The package 221 has a shape such that an upper body 221a which is located above the leads 225 becomes smaller with respect to a lower body 221b which is located below the leads 225. In addition, as shown in FIG. 39 which shows the semiconductor device 220 with the radiator member 222 removed, a stepped part is formed between the upper and lower bodies 221a and 221b due to the difference between the sizes of the upper and lower bodies 221a and 221b. The outer leads 225b of the leads 225 are exposed at the upper surface of the stepped part, that is, at the upper surface of the lower body 221b. The outer leads 225b are shaped into the gull-wing shape on the outside of the lower body 221b to suit mounting of the semiconductor device 220 on the circuit substrate or the like.

Figure 40:
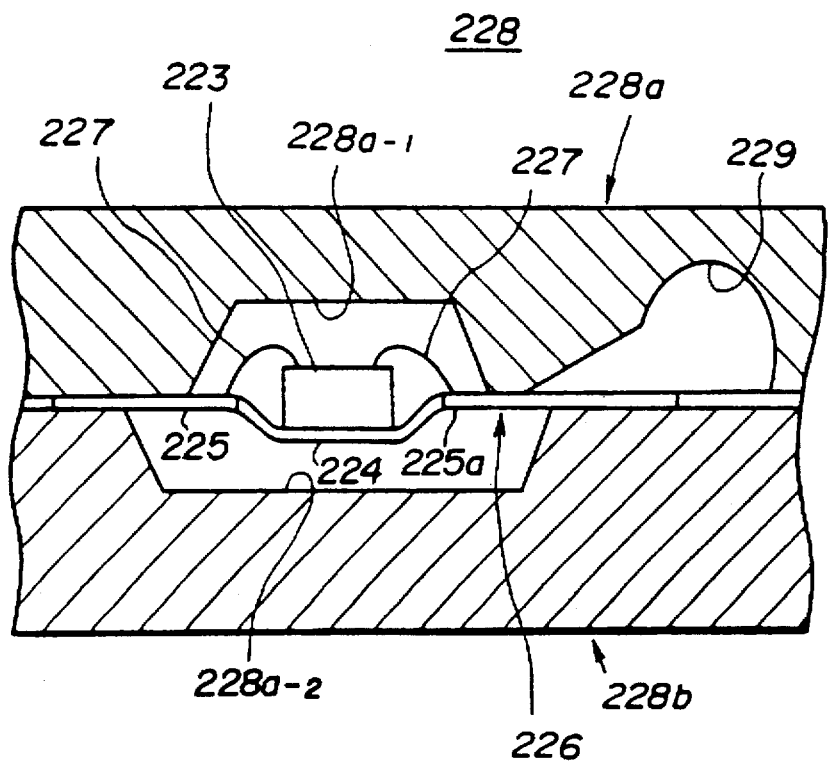
FIG. 40 is a cross sectional view for explaining a method of producing the tenth embodiment of the semiconductor device.

Next, a description will be given of a method of producing the package 221 having the upper body 221a which is smaller than the lower body 221b, by referring to FIG. 40. In FIG. 40, the semiconductor chip 223 is die-bonded on the stage 224 of a lead frame 226 which already has the stage 224 and the leads 225 formed thereon. The semiconductor chip 223 and the inner leads 225a are bonded by wires 227. The lead frame 226 having the semiconductor chip 223 mounted thereon is inserted into a metal die 228 which is made up of upper and lower dies 228a and 228b. A cavity 228a-1 formed in the upper die 228a is smaller than a cavity 228a-2 formed in the lower die 228b.

Accordingly, by injecting a resin into a gate 229 which is formed in the upper die 228a, the package 221 having the upper body 221a smaller than the lower body 221b is formed. The process of forming the package 221 is basically the same as that of the conventional process, except that the shapes of the cavities 228a-1 and 228a-2 are mutually different. Thus, although the shapes of the upper and lower bodies 221a and 221b are mutually different, it is easy to form the package 221.

Returning now to the description of FIGS. 37 and 38, the radiator member 222 is made of an aluminum plate and has a height which is approximately the same as a projecting length L of the lower body 221b from the upper body 221a. In addition, the shape of the radiator member 222 in the plan view viewed from above the semiconductor device 220 is approximately the same as the shape of the lower body 221b in the plan view. An inserting hole 230 is formed at a central part of the radiator member 222. The position of the inserting hole 230 corresponds to the position and shape of the upper body 221a.

The radiator member 222 having the construction described above is provided on the stepped part formed between the upper and lower bodies 221a and 221b, and is fixed on the package 221 by an adhesive agent 231 which has a high thermal conduction. In this fixed state, the upper body 221a fits within the inserting hole 230, and the outer leads 225b of the leads 225 extending on the lower body 221b are bonded to the radiator member 222 via the adhesive agent 231.

The size of the inserting hole 230 does not need to match the shape of the upper body 221a with a high precision, and the inserting hole 230 simply needs to be formed slightly larger than the shape of the upper body 221a. This is because the adhesive agent 231 is interposed between the upper body 221a and the radiator member 222. Accordingly, the process of forming the inserting hole 230 in the radiator member 222 does not require high precision, and the inserting hole 230 can be formed with ease. In addition, because the adhesive agent 231 is made of an insulating material, the leads 225 will not be short-circuited even though the adhesive agent 231 is bonded on the leads 225.

Next, a description will be given of the radiator function of the semiconductor device 220, by referring to FIG. 38. The radiator member 222 surrounds the upper body 221a. Furthermore, the radiator member 222 is also bonded to the leads 225 via the adhesive agent 231. For this reason, the heat which is generated from the semiconductor chip 223 mainly conducts to the outside via the package 221 and the leads 225. The heat conducting through the package 221 is transferred to the radiator member 222 at the connecting part where the inserting hole 230 and the upper body 221a meet. On the other hand, the heat conducting through the leads 225 is transferred to the radiator member 222 where the leads 225 and the radiator member 222 connect via the adhesive agent 231.

Therefore, the heat generated from the semiconductor chip 223 conducts to the radiator member 222 over an extremely large area, thereby improving the radiator efficiency. Moreover, since the radiator member 222 is constructed to surround the upper body 221a, the surface area of the radiator member 222 making contact with the atmosphere is large and the radiator efficiency is also improved thereby.

On the other hand, the height of the radiator member 222 is approximately the same as the projecting length L of the lower body 221b from the upper body 221a. In addition, the shape of the radiator member 222 in the plan view is approximately the same as the shape of the lower body 221b in the plan view. Accordingly, in the state where the radiator member 222 is mounted on the package 221, the overall height and size of the semiconductor device 220 can be kept approximately the same as those of the semiconductor device having no radiator member 222. In other words, the thickness of the semiconductor device 220 can be kept the same even if the radiator member 222 is provided. Therefore, it is possible to realize a thin semiconductor device having the improved radiator efficiency.

Figure 41:
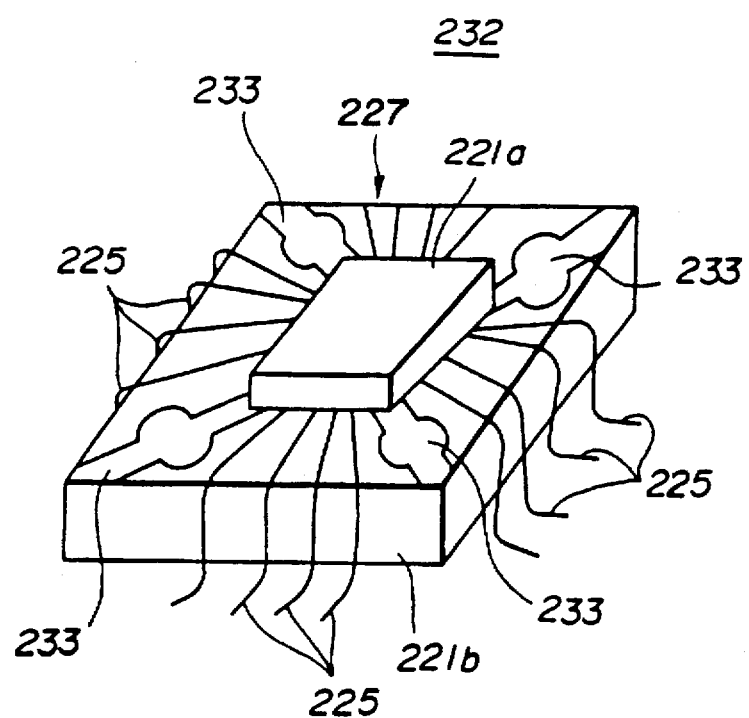
FIG. 41 is a perspective view showing an eleventh embodiment of the semiconductor device according to the present invention.

Next, a description will be given of an eleventh embodiment of the semiconductor device according to the present invention, by referring to FIG. 41. In FIG. 41, those parts which are the same as those corresponding parts in FIGS. 38 and 39 are designated by the same reference numerals, and a description thereof will be omitted.

As is well known, a stage which is mounted with a semiconductor chip is supported on a frame of a lead frame by a support member referred to as a support bar. In the tenth embodiment of the semiconductor device, only the leads 225 (outer leads 225b) of the semiconductor device 220 extend outside the package 221 and the support bar is hidden within the package 221.

But in this eleventh embodiment of the semiconductor device, a support bar 233 also extends outside a package 227 of a semiconductor device 232 together with outer leads 225a of the leads 225. In addition, the support bar 233 is bonded to the radiator member 222 via the adhesive agent 231.

The semiconductor chip 223 is mounted on the stage 224, and this stage 224 conducts most of the heat generated from the semiconductor chip 223. Hence, by extending the support bar 233 which is integrally formed on the stage 224 outside the package 221 and bonding the support bar 233 to the radiator member 222 via the adhesive agent 231, it becomes possible to more efficiently radiate the heat which is generated from the semiconductor chip 223.

Of course, the tenth and eleventh embodiments of the semiconductor device are not limited to the surface mounting type package, but is also applicable similarly to other package structures.

FIGS. 42 through 45 respectively show modifications of the fourth through the seventh embodiments of the semiconductor device shown in FIGS. 10 through 13. In FIGS. 42 through 45, those parts which are the same as those corresponding parts in FIGS. 10 through 13 are designated by the same reference numerals, and a description thereof will be omitted. These modifications also have a radiator member.

Figure 42:
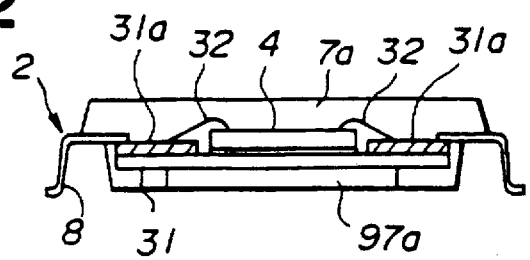
FIGS. 42 through 45 are cross sectional views respectively showing modifications of the fourth through seventh embodiments of the semiconductor device shown in FIGS. 10 through 13.

In FIG. 42, a radiator plate 97a is provided on the back surface of the substrate 31, and this radiator plate 97a is exposed when the resin molding process is made.

Figure 43:
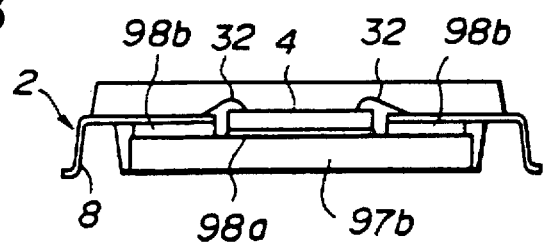

In FIG. 43, the chip 4 is adhered on a radiator plate 97b by an adhesive agent 98a. In addition, the radiator plate 97b is adhered on the lead frame (inner leads) 2 by an adhesive agent 98b. The radiator plate 97b is exposed when the resin molding process is made.

Figure 44:
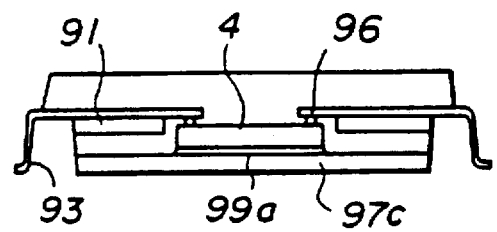

In FIG. 44, the leads 93 are formed on the tape carrier 91, and the chip 4 is bonded on the tape carrier 91 by the flip-chip bonding. In other words, a bump 96 bonds each lead 93 to the chip 4. A radiator plate 97c is adhered to the back surface of the chip 4 by an adhesive agent 99a. The radiator plate 97c is exposed when the resin molding process is made.

Figure 45:
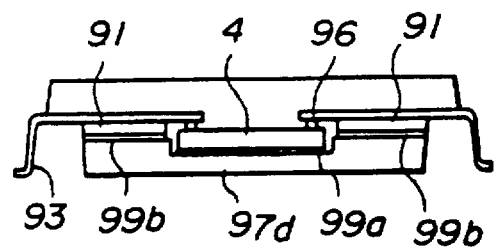

In FIG. 45, the tape carrier 91 shown in FIG. 44 is adhered to a radiator plate 97d by an adhesive agent 99b, so as to replace the lower resin 7b by the radiator plate 97d.

According to these modifications of the fourth through seventh embodiments of the semiconductor device, it is possible to efficiently radiate the heat which is generated from the chip 4 because each of the radiator plates 97a through 97d are made of a material having a thermal conductivity higher than that of the package 7.

Further, the present invention is not limited to these embodiments, but various variations and modifications may be made without departing from the scope of the present invention.

What is claimed is:

1. A method of producing a semiconductor device comprising the steps of:

(a) placing a semi-completed device having leads in a molding position within a cavity which is formed by first and second dies which connect via a palette, said cavity being formed by a recess of the first die and an opening of the palette, said first die having a first gate which communicates to the recess, said palette having a second gate which communicates to the opening, at least one of the first die and the palette having a runner which communicates with the first and second gates; and (b) injecting a resin into the cavity via the runner and the first and second gates to mold a resin package which encapsulates the semi-completed device so that the leads extend outwardly from the resin package, said recess being larger than the opening so that a portion of the package above the leads is larger than the remaining portion of the package below the leads and the leads are exposed at a stepped part which is formed by a difference between the sizes of the two portions forming the package.

2. The method of producing the semiconductor device as claimed in claim 1, wherein said step (b) comprises injecting the resin from the runner to the second gate via a hole in the palette.

3. The method of producing the semiconductor device as claimed in claim 1, wherein said step (b) comprises injecting the resin from the runner which is formed in only the palette.

4. The method of producing the semiconductor device as claimed in claim 1, wherein said step (b) comprises injecting the resin from the runner which is formed in only the first die.

* * * * *

UNITED STATES PATENT AND TRADEMARK OFFICE
CERTIFICATE OF CORRECTION

PATENT NO. : 5,750,421
DATED : May 12, 1998
INVENTOR(S) : KASAI et al.

It is certified that error appears in the above-identified patent and that said Letters Patent is hereby corrected as shown below:

Col. 6, line 36, after "leads" insert --5--.

Col. 7, line 65, change "$8^A$" to --$8_A$--;
line 67, change "$8^B$" to --$8_B$--.

Col. 8, line 13, change "$1^B$" to --$1_B$--.

Col. 11, line 37, change "7(A)7(C)" to --7(A)-7(C)--.

Col. 14, line 8, begin a new paragraph at "Tip".

Signed and Sealed this

Seventeenth Day of November, 1998

Attest:

BRUCE LEHMAN

Attesting Officer    Commissioner of Patents and Trademarks